United States Patent [19]
Biernath

[11] Patent Number: 5,827,084
[45] Date of Patent: Oct. 27, 1998

[54] ELECTRICAL CONNECTOR ASSEMBLY WITH INTERLEAVED MULTILAYER STRUCTURE AND FABRICATION METHOD

[75] Inventor: Rolf W. Biernath, Maplewood, Minn.

[73] Assignee: Minnesota Mining and Manufacturing Company, St. Paul, Minn.

[21] Appl. No.: 17,388

[22] Filed: Feb. 2, 1998

Related U.S. Application Data

[62] Division of Ser. No. 839,280, Apr. 17, 1997, Pat. No. 5,741,148, which is a continuation of Ser. No. 346,735, Nov. 30, 1994, abandoned.

[51] Int. Cl.⁶ .................................................... H05K 3/00
[52] U.S. Cl. ............................ 439/262; 29/829; 439/632
[58] Field of Search ..................... 439/61, 284, 492–499, 439/713–717, 76–79, 262, 65–67, 632; 361/398, 749; 29/825–830, 874, 876

[56] References Cited

U.S. PATENT DOCUMENTS

| | | | |
|---|---|---|---|
| 1,917,009 | 7/1933 | Betts et al. | 439/262 |
| 3,601,759 | 8/1971 | Barker | 439/262 |
| 4,873,764 | 10/1989 | Grimm | 29/830 |
| 5,219,292 | 6/1993 | Dickirson et al. | 439/67 |

*Primary Examiner*—Neil Abrams
*Assistant Examiner*—Brian J. Biggi
*Attorney, Agent, or Firm*—H. Sanders Gwin

[57] ABSTRACT

An electrical connector assembly having an interleaved multilayer structure includes a first connector structure having at least a first connector layer, and a second connector structure having at least second and third connector layers. A plurality of conductive contact surfaces are disposed along edge portions of the connector layers. Upon engagement of the first connector structure and the second connector structure, the first connector layer is oriented to engage a gap defined between the second and third connector layers. The interleaved engagement of the connector layers results in an low-profile electrical connector assembly providing a large number of interconnections between respectively aligned contact surfaces with precise alignment and reliable electrical contact. The connector layers may include conductive contact surfaces on one or both sides of each layer to provide higher interconnection densities. The disposition of contact surfaces on both sides of a layer can relax alignment tolerances for a given interconnection density. Nevertheless, precise alignment can be ensured by the use of conventional lithographic techniques to print the contact surfaces. At least some of the connector layers can be made from a material capable of resilient deformation, and can be realized, for example, by flexible printed circuit board layers or flex circuit layers. The resiliently deformable material, when deformed, produces a force that resists deformation. Thus, when interleaved engagement of the connector layers produces deformation, the resisting force serves to bias the connector layers against one another to ensure good electrical contact force.

7 Claims, 7 Drawing Sheets

ELECTRICAL CONNECTOR ASSEMBLY WITH INTERLEAVED MULTILAYER STRUCTURE AND FABRICATION METHOD

This is a division of application Ser. No. 08/839280 filed Apr. 17, 1997 now U.S. Pat. No. 5,741,148 which is a file wrapper continuation of application Ser. No. 08/346,735 filed Nov. 30, 1994, abandoned.

FILED OF THE INVENTION

The present invention relates to electrical connectors and, more particularly, to electrical connectors for making high-density, separable interconnections.

DISCUSSION OF RELATED ART

Many electronic systems employ printed circuit boards and flex circuits to integrate a variety of hardware and circuitry in a single, modular package. In electronic systems having printed circuit boards or flex circuits, it is necessary to provide electrical connector assemblies to make interconnections between printed circuit boards and other printed circuit boards, printed circuit boards and flex circuits, flex circuits and other flex circuits, and either printed circuit boards or flex circuits and other system components. The interconnections can be made directly or by the use of cables having end connectors. Printed circuit boards, flex circuits, and cables, as well as active system components requiring interconnection, will be collectively referred to herein as "electronic devices." The complexity of printed circuit boards, flex circuits, and other electronic devices and the space constraints present in many electronic systems, such as computers, require electrical connector assemblies capable of making a large number of interconnections in a limited area and volume. In addition, it is ordinarily required that such electrical connector assemblies be made separable to enable the electronic devices to be disconnected and interchanged for purposes such as upgrade, repair, or modification.

Several types of high-density, separable electrical connector assemblies presently exist. One well known type of electrical connector assembly is fabricated using MSA (mold, stamp, assemble) techniques. An MSA connector assembly typically includes a plurality of stamped metal spring contacts that are assembled in a molded plastic housing. Another plastic housing includes a plurality of stamped, mating contacts aligned with the spring contacts. The housings are attached to electronic devices and include means for connecting the spring contacts and mating contacts to interconnection terminals, such as solder terminals, provided on the devices. The spring contacts are mounted in opposing pairs and together function to receive and compressively hold the mating contacts upon engagement of the plastic housings. The compressive force of the spring contacts on the mating contacts provides a contact force that makes the desired interconnections between the electronic devices.

The MSA-type connector assembly is widely used with generally satisfactory results for low to medium interconnection densities, but suffers from a number of problems when interconnection density is increased. Specifically, higher interconnection densities require that the stamped metal contacts have smaller sizes in order to fit a larger number of contacts within the same housing space. The reduced sizes produce structurally "flimsy" contacts that can result in both unreliable electrical contact force and inaccurate alignment of mating contacts. The higher number of contacts also increases the part-count per assembly and produces a much finer pitch between adjacent contacts. The increased part-count results in higher manufacturing costs and greater complexity. The finer pitch produces alignment problems between mating contacts. The problems combine to reduce the yield from the stamping and assembly process. For example, an MSA-type connector assembly providing two-hundred interconnections must have two-hundred contacts stamped and assembled for each plastic housing. Each stamped contact must be inserted correctly into the plastic housing, and placed in precise alignment with a mating contact in the other housing. At higher interconnection densities, alignment tolerance may be as low as a few thousandths of an inch in the x-y-z dimensions of the housing. Deviation from acceptable dimensional or positional tolerances by any one of the stamped metal contacts can be cause to reject the entire connector assembly as defective.

One variation of the MSA-type connector assembly substitutes a single flex circuit layer for one of the plastic housings. The flex circuit typically includes contact pads on one surface. Stamped metal springs provided in the plastic housing of the MSA-type connector compressively engage the flex circuit contact pads, thereby making desired interconnections between the flex circuit and the electronic device coupled to the spring contacts. The alignment and strength considerations pertinent to the conventional MSA-type connector assembly are still a concern in this flex-to-MSA arrangement, but the part-count is halved by the use of the flex circuit. Unfortunately, flex circuits used in this type of separable connector typically provide only a few dozen contacts due to alignment problems, limiting the interconnection density that can be achieved.

Another type of connector assembly employs a z-axis conductive elastomer structure to make interconnections between printed circuit boards and flex circuits. The z-axis elastomer typically is sandwiched between contact pads provided on a flex circuit and contacts pads on a printed circuit board. A precisely sized plastic or metal housing and pressure bars are bolted into place over the z-axis elastomer interconnection. This z-axis elastomer-type connector assembly has substantially fewer parts than the MSA-type connector assembly and can achieve much higher contact densities. Consequently, z-axis elastomer-type connector assemblies are frequently used for connection of liquid crystal displays to printed circuit boards. Because such connector assemblies often can be from three to seven inches long, however, alignment is a significant problem that can result in rejection of an entire connector assembly. In addition, substantial board real estate and volume can be consumed by the connector housing, pressure bars, and special equipment often necessary to ensure proper alignment. Finally, although the z-axis elastomer-type connector assembly is considered separable, as a practical matter, the connection and disconnection of such connector assemblies is difficult due to board-to-board alignment problems at fine contact pitches and problems in using the cumbersome hardware associated with the connector.

Another type of connector assembly used for connections between printed circuit boards employs an edge connector on one of the boards. The edge connector typically comprises a plastic housing mounted on one of the printed circuit boards and contains stamped metal spring contacts, as in the conventional MSA-type connector assembly. However, the other printed circuit board includes contact pads along an edge of either one or both sides of the board. The printed circuit board with the contact pads is inserted directly into the plastic housing on the other board. The stamped spring contacts compressively engage appropriate contact pads and thereby make the desired interconnections between the printed circuit boards. Like the flex-to-MSA connector assembly, this edge-connector assembly has fewer parts but still suffers from alignment and strength problems at fine contact pitches.

The variety of problems encountered by existing electrical connector assemblies, e.g., structural weakness, contact misalignment, complexity, cost, and size, when faced with higher interconnection density requirements demonstrate a need for an improved electrical connector assembly. In particular, there is a need for an electrical connector assembly capable of achieving high interconnection densities with equivalent electrical contact reliability, reduced complexity, reduced cost, and reduced size.

SUMMARY OF THE INVENTION

In view of the foregoing problems associated with existing electrical connector assemblies configured for high-density, separable interconnection, the present invention relates to an electrical connector assembly having an interleaved multilayer structure, and a method for fabricating such an electrical connector assembly. The interleaved multilayer structure can provide a low-profile, low-cost electrical connector assembly that achieves high interconnection density with precise alignment and reliable electrical contact. For example, the interleaved multilayer structure can be realized by a plurality of connector layers, such as inexpensive printed circuit layers or flex circuits, arranged in a low-profile stack. The connector layers may include conductive contact surfaces on one or both sides of each layer to provide higher interconnection densities. The disposition of contact surfaces on both sides of a layer can relax alignment tolerances for a given interconnection density. Nevertheless, precise alignment can be ensured by the use of conventional lithographic techniques to print the contact surfaces. At least some of the connector layers can be made from a resiliently deformable dielectric material that, when deformed, produces a force that resists deformation, tending to return the material at least partially to its undeformed state. The connector layers provided in opposite connector structures can be engaged in an interleaved fashion, much like a deck of cards. Thus, when interleaved engagement of the connector layers produces deformation, the resisting force serves to bias the connector layers against one another to ensure good electrical contact force.

Additional features and advantages of the present invention will be set forth in part in the description that follows, and in part will be apparent from the description, or may be learned by practice of the present invention. The advantages of the present invention will be realized and attained by means particularly pointed out in the written description and claims hereof, as well as in the appended drawings.

To achieve the foregoing advantages, as broadly embodied and described herein, the present invention provides, in a first embodiment, an electrical connector assembly comprising a first connector structure having at least a first connector layer, the first connector layer having an edge portion and a plurality of conductive contact surfaces disposed along the edge portion, and a second connector structure having at least second and third connector layers, each of the second and third connector layers having an edge portion and a plurality of conductive contact surfaces disposed along the respective edge portion, and each of the second and third connector layers including a material capable of resilient deformation, wherein the second and third connector layers define a gap therebetween adjacent the edge portions of the second and third connector layers, and wherein the first connector layer is oriented to engage the gap upon engagement of the first connector structure and the second connector structure, thereby coupling at least some of the conductive contact surfaces of the first connector layer to at least some of the conductive contact surfaces of the second and third connector layers.

The present invention provides, in a second embodiment, an electrical connector assembly comprising a first connector structure having at least first, second, and third connector layers, each of the first, second, and third connector layers having an edge portion and a plurality of conductive contact surfaces disposed along the edge portion, the second connector layer being disposed adjacent the first connector layer, and the third connector layer being disposed adjacent the second connector layer opposite the first connector layer, wherein at least each of the first and third layers includes a material capable of resilient deformation, and wherein the first and second connector layers define a first gap therebetween adjacent the edge portions of the first and second connector layers, and the second and third connector layers define a second gap therebetween adjacent the edge portions of the second and third connector layers, and a second connector structure having at least fourth and fifth connector layers, each of the fourth and fifth connector layers having an edge portion and a plurality of conductive contact surfaces disposed along the respective edge portion, wherein the fourth and fifth connector layers define a third gap therebetween adjacent the edge portions of the fourth and fifth connector layers, and wherein the fourth and fifth connector layers are oriented to engage the first and second gaps, respectively, upon engagement of the first connector structure and the second connector structure, and the second connector layer is oriented to engage the third gap upon engagement of the first connector structure and the second connector structure, thereby coupling at least some of the conductive contact surfaces of the fourth and fifth connector layers to at least some of the conductive contact surfaces of the first, second, and third connector layers.

In a third embodiment, the present invention provides an electrical connector structure comprising a first connector layer, the first connector layer having a first edge portion and a plurality of conductive contact surfaces disposed along the first edge portion, wherein the first connector layer includes a material capable of resilient deformation, a second connector layer, the second connector layer having a second edge portion and a plurality of conductive contact surfaces disposed along the second edge portion, wherein the second connector layer includes a material capable of resilient deformation, and a gap defined between the first and second connector layers adjacent the edge portions of the first and second connector layers, the gap being oriented to engage a second connector structure, thereby coupling at least some of the conductive contact surfaces of the first connector layer and the second connector layer to conductive contact surfaces associated with the second connector structure.

In a fourth embodiment, the present invention provides a method for fabricating a plurality of electrical connector assemblies, the method comprising the steps of forming a plurality of first connector structures by a plurality of steps including providing a first connector layer, forming a plurality of conductive contact surfaces in each of a plurality of regions of the first connector layer, and separating sections of the first connector layer to form the plurality of the first connector structures, each of the sections including one of the regions of the first connector layer, and forming a plurality of second connector structures by a plurality of steps including providing a second connector and a third connector layer, each of the second and third connector layers including a material capable of resilient deformation, forming a plurality of conductive contact surfaces in each of a plurality of regions of the second connector layer, forming a plurality of conductive contact surfaces in each of a plurality of regions of the third connector layers, providing a plurality of separation layers, placing the separation layers between the second and third connector layers to form a stacked structure, the second and third layers defining a gap therebetween substantially coplanar with the plurality of separation layers, and separating sections of the stacked structure, each of the sections forming one of the plurality of second connector structures, and each of the sections including one of the regions of the second connector layer, one of the regions of the third connector layer, and a portion of one of the separation layers, wherein the first connector layer is oriented to engage the gap upon engagement of the first connector structure and the second connector structure, thereby coupling at least some of the conductive contact surfaces of the first connector layer to at least some of the conductive contact surfaces of the second and third connector layers.

It is to be understood that both the foregoing general description and the following detailed description are exemplary and explanatory only, and not restrictive of the present invention, as claimed.

BRIEF DESCRIPTION OF THE DRAWINGS

The accompanying drawings are included to provide a further understanding of the present invention and are incorporated in and constitute a part of this specification. The drawings illustrate exemplary embodiments of the present invention and together with the description serve to explain the principles of the invention.

DETAILED DESCRIPTION OF THE PREFERRED EMBODIMENTS

Figure 1:
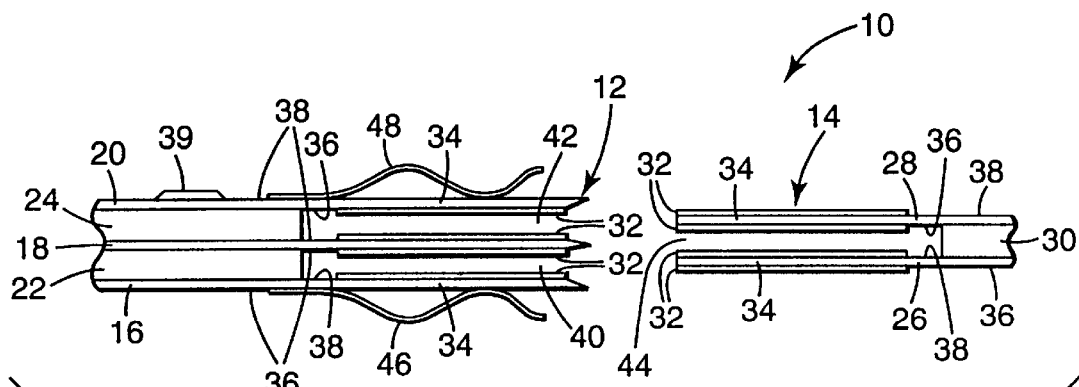
FIG. 1 is a schematic side-view of a first exemplary embodiment of an electrical connector assembly having a multilayer, interleaved structure, in accordance with,the present invention.

FIG. 1 is a schematic side-view of a first exemplary embodiment of an electrical connector assembly 10 having a multilayer, interleaved structure, in accordance with the present invention. The electrical connector assembly 10 shown in FIG. 1 includes a first connector structure 12 and a second connector structure 14 configured to physically engage one another and thereby make a plurality of electrical interconnections, as will be described. The first connector structure 12 has a first plurality of connector layers including first, second, and third connector layers 16, 18, 20, and a plurality of separation layers including first and second separation layers 22, 24, all of which are arranged in a multilayered stack. The second connector structure 14 similarly has a second plurality of connector layers including fourth and fifth connector layers 26, 28 and a separation layer 30, which are also arranged in a multilayered stack. The precise number of layers included in connector assembly 10 of FIG. 1 is purely exemplary, however, and amenable to increase or decrease according to desired interconnection densities.

In first connector structure 12, second connector layer 18 is disposed adjacent first connector layer 16, and third connector layer 20 is disposed adjacent the second connector layer opposite the first connector layer. The first separation layer 22 is disposed between first and second connector layers 16, 18, and second separation layer 24 is disposed between second and third connector layers 18, 20. In second connector structure 14, fourth and fifth connector layers 26, 28 are disposed adjacent to one another, and are separated by separation layer 30. Upon engagement of first connector structure 12 and second connector structure 14, connector layer 16, 18, 20, 26, and 28 are engaged in an interleaved fashion to provide a plurality of electrical interconnections, as will be described.

The connector layers 16, 18, 20, 26, 28 are made from a dielectric material capable of resisting buckling. One or more of connector layers 16, 18, 20, 26, 28 preferably are made from a dielectric material capable of resilient deformation, and may comprise thin, inexpensive printed circuit layers, such as printed circuit board layers or flex circuit layers. The characteristic of "resilient deformation," as used herein, refers to the ability of a material to be flexibly deformed or "bent" while, at the same time, producing a force that resists deformation, tending to push the material at least partially back to its original, undeformed position.

As will be described below, the resiliently deformable nature of connector layers 16, 18, 20, 26, 28 can provide a compressive force upon interleaved engagement of first connector structure 12 and second connector structure 14. The compressive force enhances interconnection contact force and structural durability of connector assembly 10.

A variety of known dielectric materials commonly used to form printed circuit board layers and flex circuit layers, such as polyesters, polyimides, epoxy/glass composites, paper-phenolic, cyanate ester, PEN, liquid crystal polymers, and PTFE can provide connector layers having sufficient intrinsic resilience and a resistance to buckling, for purposes of the present invention. However, ultra-thin flex circuit layers may have insufficient intrinsic resilience, and therefore may require the addition of a resiliently deformable backing material to impart additional resilience. Alternatively, a stiff backing material, such as copper, could be added to the flex circuit layer. A stiff backing material such as copper may not provide much resilience to the flex circuit layer, but will at least impart stability to resist buckling of the flex circuit layer upon interleaved engagement of first connector structure 12 and second connector structure 14. In addition, a copper backing material can perform a dual function, providing both structural stability and a ground plane. A backing material may not be necessary if an external biasing means is provided to force the flex circuit layers against mating layers, as in a zero insertion force (ZIF) or low insertion force (LIF) assembly, to be described below. The separation layers 22, 24, 30 need not be formed from a resilient material and may even be formed from a rigid or compliant material in some instances, as will be apparent from the description below.

Figure 2:
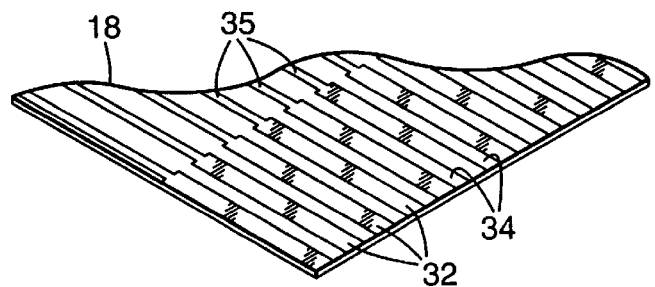
FIG. 2 is a partial schematic top-perspective view of a connector layer forming part of the electrical connector assembly shown in FIG. 1.

As shown in FIG. 1, each of connector layers 16, 18, 20, 26, 28 includes a plurality of conductive contact surfaces 32 disposed along an edge portion 34 of the respective connector layer. For purposes of illustration, the thicknesses of contact surfaces 32 in FIG. 1 are somewhat exaggerated. FIG. 2 is a top perspective view of second connector layer 18, for purposes of illustrating the arrangement of conductive contact surfaces 32 along edge portion 34. With reference to FIG. 2, conductive contact surfaces 32 may comprise contact pads disposed side-by-side along edge portion 34, and coupled to conductive traces 35 formed along the length of the respective connector layers. Conductive traces 35 are not shown in FIG. 1 so that conductive contact surfaces 32 can be more readily identified. In FIG. 2, conductive contact surfaces 32 have equal lengths and end at the same point on edge portion 34. However, contact surfaces 32 may be formed with a staggered configuration such that the lengths of some of the contact surfaces end at different points on edge portion 34. In this manner, interconnections can be made at different points when first connector structure 12 and second connector structure 14 are engaged. For example, it may be desirable to make ground interconnections first, followed by power interconnections, signal interconnections, and perhaps device ID interconnections.

The connector layers 16, 18, 20, 26, 28 can also be provided with slots formed in edge portions 34 between adjacent contact surfaces 32. The slots provide a "cantilever" effect that enables individual contact surfaces 32 to flex somewhat independently of adjacent contact surfaces. This cantilever effect may be desirable as a means to enable individual contact surfaces 32 to adapt to the contour of a mating contact surface, which may, for example, carry a contact bump or other force concentrating means. The conductive traces 35 can be coupled to circuits formed integrally with either of connector structures 12, 14 or to separate electronic devices coupled to the respective connector structure. The second, fourth, and fifth connector layers 18, 26, 28 may include contact surfaces 32 on two opposing major surfaces 36, 38. However, first and third connector layers 16, 20 need only include contact surfaces 32 on a respective interior major surface 38, 36, because the first and third connector layers are configured to engage another connector layer only on that surface, as shown in FIG. 1.

The contact surfaces 32 and conductive traces 35 can be formed by conventional lithographic techniques involving the deposition of a conductive material, such as copper, over the dielectric connector layer, followed by steps of printing and etching the conductive material to define a conductive trace pattern. The use of lithographic techniques enables extremely precise alignment of mating contact surfaces 32 in the edge portions 34 of connector layers 16, 18, 20, 26, 28, and eliminates the need to individually stamp and insert large numbers of discrete contact surfaces, as would be the case with conventional MSA connector assemblies. The use of lithographic techniques also enables much of the wiring previously done in the electronic device, such as a printed circuit board, to be done in the connector assembly, in accordance with the present invention. Specifically, the extensive number of ground connections ordinarily made at the printed circuit-connector interface can be made by connecting conductive traces 35 in connector assembly 10. The conductive traces 35 connected in connector assembly 10 then can be commonly coupled to a much lesser number of pins, or other coupling means, that make connections with ground terminals on the electronic device to which the connector is coupled. If the connector assembly 10 is coupled to a printed circuit board, for example, the result is a significant savings in board real estate at the interface between the board and the connector assembly. Alternatively, a larger solder pad with increased spacing can be used, relaxing manufacturing tolerances to reduce cost and increase reliability.

The connector layers 16–24 of first connector structure 12 and layers 26–30 of connector structure 14 can be held together to produce integral, stacked constructions. For example, each of layers 16–30 can be bonded to adjacent layers by lamination or other means. The stacked connector structures 12, 14 exhibit very low profiles and small form factors, and readily accommodate the formation of interlaminate connections to any of connector layers 16, 18, 20 or to connector layers 26, 28. The stacked, interlaminate arrangement enables connector structures 12, 14 to be realized as either discrete connector structures, continuous printed circuit boards with integral connector structures, continuous printed flex circuits with integral connector structures, or any combination thereof Thus, in accordance with the present invention, connector structures 12, 14 can be readily configured to provide at least the following interconnection arrangements:

(1) direct board-to-board interconnections in which each of connector structures 12, 14 is a continuous printed circuit board with an integral, mating connector structure;

(2) direct board-to-flex interconnections in which one of connector structures 12, 14 is a continuous printed circuit board and the other is a continuous flex circuit, each with an integral, mating connector structure;

(3) direct flex-to-flex interconnections in which connector structures 12, 14 are continuous flex circuits with integral, mating connector structures;

(4) indirect board-to-board, board-to-flex, or flex-to-flex interconnections in which either or both connector structures 12, 14 is a discrete connector structure mounted on an edge of or otherwise coupled to a continuous printed circuit board or a continuous flex circuit; or (5) board-to-cable or flex-to-cable interconnections in which at least one of connector structures 12, 14 is a discrete connector structure coupled to one end of a cable.

The above interconnection arrangements (1)–(5) should not be considered limiting, but rather representative of a variety of arrangements that may occur to one skilled in the art, in view of this description.

The ability of connector structures 12, 14 to be formed from printed circuit board layers or flex circuit layers, whether discrete or continuous, enables the incorporation of passive electronic components and/or active integrated circuit components in the connector structure. Specifically, passive electronic components such as resistors, capacitors, and inductors can be mounted on or formed in respective connector layers 16, 18, 20, 26, 28 and coupled to one or more of conductive contact surfaces 32 to provide so-called "smart" connectors. The passive components can be configured to provide connector assembly 10 with a variety of built-in functions such as, for example, filtering, attenuation, and impedance matching. Integrated circuit components similarly can be mounted on or formed in respective connector layers 16, 18, 20, 26, 28 and coupled to one or more conductive contact surfaces 32 to provide active functionality such as, for example, amplification gain, signal detection, and signal conversion. Such components can be individually selected for addition to discrete or continuous connector structures 12, 14 to realize custom connector assemblies for specific applications. FIG. 1 shows an example of an integrated circuit component or passive component mounted on a surface of connector layer 20, and designated by reference numeral 39.

Each of connector structures 12, 14 also could be configured to realize a controlled impedance connector. For example, the dimensions of connector layers 16, 18, 20, 26, 28 could be carefully selected to control the impedance of conductive traces 35 and conductive contact surfaces 32. The impedance also could be controlled by the selection of dielectric materials having particular dielectric properties.

As shown in FIG. 1, first and second connector layers 16, 18 of first connector structure 12 define a first gap 40 therebetween at the edge portions 34 of the first and second layers. The second and third connector layers 18, 20 of first connector structure 12 define a second gap 42 therebetween at the edge portions 34 of the second and third layers. The fourth and fifth connector layers 26, 28 of second connector structure 14 similarly define a third gap 44 therebetween at the edge portions 34 of the fourth and fifth layers. The separation layers 22, 24, and 30 are in substantial planar alignment with gaps 40, 42, 44, respectively, as shown in FIG. 1. However, separation layers 22, 24, 30 stop short of the edge portion 34 of the respective connector layers 16, 18, 20, 26, 28, thereby leaving space for gaps 40, 42, 44. Because separation layers 22, 24, 30 do not extend into gaps 40, 42, 44, the separation layers will not restrict deformation of edge portions 34 of connector layers 16, 18, 20, 26, 28, and therefore need not be formed from a resiliently deformable material. Upon physical engagement of first connector structure 12 and second connector structure 14, connector layers 16, 18, 20, 26, 28 engage one another in an interleaved fashion, much like a deck of cards. Specifically, fourth and fifth connector layers 26, 28 are oriented to engage first and second gaps 40, 42, respectively, and second connector layer 18 is oriented to engage third gap 44. As shown in FIG. 1, leading edges of edge portions 34 may be angled or "pointed" to facilitate insertion of connector layers 18, 26, 28 into gaps 44, 40, 42, respectively.

The gaps 40, 42, 44 preferably are dimensioned to have widths narrow enough to provide a snug fit for connector layers 26, 28, and 18, respectively. The simultaneous insertion of connector layers 18, 26, 28 into the narrow gaps 44, 40, 42, respectively, creates deformation forces that contribute to a compressive fit of the overall interleaved assembly 10. Upon insertion into gap 44, the first major surface 36 of second connector layer 18 makes contact with the second major surface 38 of fourth connector layer 26, and the second major surface 38 of second connector layer 18 makes contact with the first major surface 36 of fifth connector layer 28. The resulting contact by second connector layer 18 tends to bias connector layers 26 and 28 outward, away from both second connector layer 18 and the undeformed positions of connector layers 26, 28. At the same time, upon insertion into gaps 40, 42, respectively, fourth connector layer 26 makes contact with the second major surface 38 of first connector layer 16, and fifth connector layer 28 makes contact with first major surface 36 of third connector layer 20. The contact between connector layers 26, 28 and connector layers 16, 20 similarly tends to bias connector layers 16, 20 outward, away from both second connector layer 18 and the undeformed positions of connector layers 16, 20.

By virtue of their resilience, connector layers 16, 20, 26, 28 produce a force that resists the bias force, tending to push the respective connector layers back toward their undeformed positions, and thus in an inward direction toward second connector layer 18. The resisting force imparts a compressive force to connector layers 16, 20, 26, 28 that provides a compressive fit to the interleaved connector structures 12, 14. Specifically, upon interleaved engagement of connector structures 12, 14, the resisting force compresses: the second major surface 38 of first connector layer 16 against the first major surface 36 of fourth connector layer 26, the second major surface 38 of fourth connector layer 26 against the first major surface 36 of second connector layer 18, the first major surface 36 of third connector layer 20 against the second major surface 38 of fifth connector layer 28, and the first major surface 36 of fifth connector layer 28 against the second major surface 38 of second connector layer 18.

The connector assembly 10, upon engagement of first and second connector structures 12, 14, can be characterized as providing a so-called "spring-reserve interference"-type engagement. The term "interference" refers to the interference forces produced between the various connector layers when second connector layer 18 engages gap 44 and fourth and fifth connector layers 26, 28 engage gaps 40, 42, respectively. The term "spring-reserve" refers to the ability of connector layers 16, 20, 26, 28, upon engagement of first and second connector structures 12, 14, to respond to deformation with a spring force that produces a compressive fit, thereby holding the connector structures together and providing good contact force, but which still enables the connector structures to be separated.

The degree of interference I for engagement of a single connector layer with a single gap can be represented by the following expression:

$$I = D - d_o$$

where D is the thickness of the connector layer and $d_o$ is the width of the gap into which the connector layer is inserted.

Thus, the total interference $I_{total}$ for the connector assembly 10 of FIG. 1 can be represented by the following expression:

$$I_{total} = \sum_{i=1}^{n} D_i - \sum_{i=1}^{m} d_{oj}$$

where $D_i$ represents the thickness for each connector layer of a plurality of connector layers 1–n, and $d_{oj}$ represents the width for each gap of a plurality of gaps 1–m. The total interference $I_{total}$ for connector assembly 10 is then the sum of connector layer thicknesses minus the sum of gap widths. The degree of spring force is a function of the interference, the spring characteristics of the material used to form connector layers 16, 18, 20, 26, 28, and the dimensions of the connector layers. In accordance with the present invention, the interference and spring force existing in connector assembly 10 preferably are selected to provide a contact force of greater than approximately 0.5 grams per contact surface 32, to ensure good electrical contact reliability. It is expected that one skilled in the art, in view of this description, will be capable of adjusting interference and spring force parameters to arrive at a connector assembly 10 providing suitable contact force, in accordance with the present invention.

The conductive contact surfaces 32 are aligned such that when connector layers 16, 26, 28 are inserted into gaps 44, 40, 42, respectively, the contact surfaces of connector layers 26, 28 are electrically coupled to respective contact surfaces of connector layers 16, 18, 20, and vice versa. The coupled contact surfaces 32 serve to provide a high interconnection density between conductive traces 35 associated with first connector structure 12 and second connector structure 14. With reference to the example of FIG. 1, in particular, the stacked, interleaved connectors layers 16, 18, 20, 26, 28 provide four separate interconnection sites in a connector assembly 10 having a very low profile due to the small thickness of the connector layers. The interconnection sites exist at the interfaces of first and fourth connector layers 16, 26, second and fourth connector layers 18, 26, second and fifth connector layers 18, 28, and third and fifth connector layers 20, 28. Even though precise alignment can be achieved between mating contact surfaces 32, as a result of availability of lithographic techniques, the contact surfaces need not be made with small pitch and size. Rather, higher interconnection densities can be achieved with moderate contact pitch and size, because of the large number of interconnection sites provided by the stacked, interleaved connector layers 16, 18, 20, 26, 28. Thus, the structure of connector assembly 10 relaxes alignment tolerances and increases the required contact spacing as a function of the number of stacked connector layers provided in first and second connector structures 12, 14.

The compression fit of connector structures 12, 14 enhances the electrical contact force existing between aligned conductive contact surfaces 32. In addition, the compression fit produces a wiping action as connector layers 16, 18, 20, 26, 28 engage one another. The wiping action scrapes respective conductive contact surfaces 32 against one another as connector layers 16, 26, 28 are slid into their respective gaps 44, 40, 42, thereby cleaning debris and oxidation from the contact surfaces to enhance the electrical reliability of the interconnections. It is also noted that the opening provided by gaps 40, 42, 44 enables contact surfaces 32 to be accessed for manual cleaning after disengagement of connector structures 12, 14.

The compressive fit produced by interleaved engagement of first connector structure 12 and second connector structure 14 can be further improved by the incorporation of a biasing means. With reference to FIG. 1, for example, the biasing means may comprise a set of leaf springs 46, 48 mounted on exterior surfaces of first connector structure 12 and oriented to bias first and third connector layers 16, 20, respectively, inward toward second connector layer 18. Alternative biasing means such as elastomeric bands, adjustable frames, hydrostatic bladders, and camming devices are also contemplated. As another alternative, one or both of connector layers 16, 20 can be worked in a press to mold an integral spring form into the connector layer that supplements its intrinsic resilience. The force exerted by the biasing means will again be a function of the interference between connector layers 18, 26, 28 and gaps 44, 40, 42, respectively, the spring characteristics of the biasing means, and the dimensions of the biasing means, and thus will be subject to adjustment by one skilled in the art, in view of this description.

In the example of FIG. 1, first leaf spring 46 is mounted across the first major surface 36 of first connector layer 16 and biases the first connector layer against fourth connector layer 26, whereas second leaf spring 48 is mounted on the second major surface 38 of third connector layer 20 and biases the third connector layer against fifth connector layer 28. The leaf springs 46, 48 apply a compressive force that complements the resistive force generated due to the resilience of first and third connector layers 16, 20. The compressive forces further enhance the contact force generated between respective conductive contact surfaces 32 upon engagement of connector layers 18, 26, 28 with gaps 44, 40, 42, respectively. In addition, the compressive force assists in holding first connector structure 12 and second connector structure 14 together upon engagement to provide a separable, but structurally durable connector assembly 10. If desired, the leaf springs 46, 48 can be provided with slots aligned parallel to the gaps between adjacent contact surfaces 32. The slots can provide a "cantilever beam" effect for independent flexure, particularly if slots also are formed in edge portions 34 between adjacent contact surfaces 32, as described above.

An advantage of the stacked, interleaved structure of connector assembly 10 is that the compressive force applied by the biasing means, e.g., springs 46, 48, is distributed in series across a plurality of stacked, thin beam structures, in the form of connector layers 16, 18, 20, 26, 28. A layer commonly is characterized as a "thin beam" if it has an aspect ratio (length to thickness) of greater than approximately 3:1. The stacked arrangement of conductive contact surfaces 32, in combination with the thin beam characteristic of each of connector layers 16, 18, 20, 26, 28, permits the mechanical force applied by the biasing means to be sustained across all of the contacts in series. As a result, the total force necessary to achieve reliable electrical contact is significantly less than if all mated contacts were individually loaded in parallel. In addition, the series force produced by the biasing means is complemented by the compressive fit already provided by the combination of the intrinsic resilience of connector layers 16, 18, 20, 26, 28 and the snug fit of gaps 40, 42, 44. As a result, reliable electrical contact force is more easily achieved by connector assembly 10.

Figure 3:
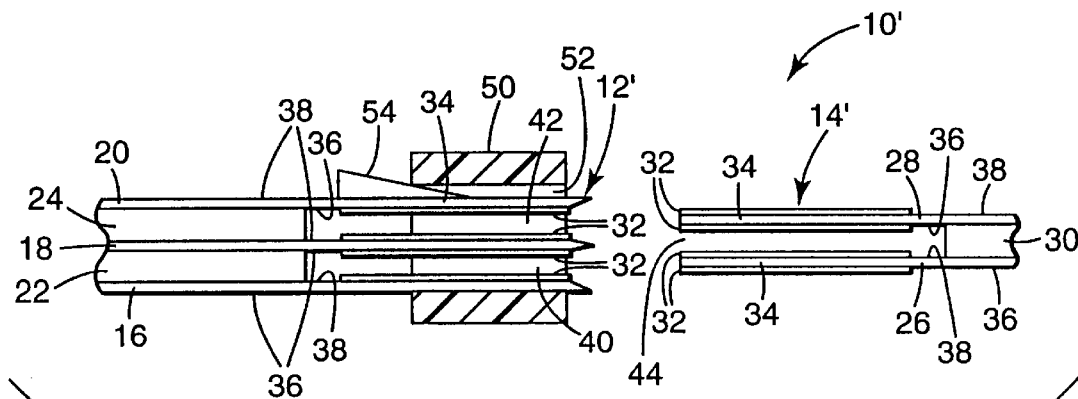
FIG. 3 is a schematic side-view of a second exemplary embodiment of an electrical connector assembly having a multilayer, interleaved structure, in accordance with the present invention.

FIG. 3 is a schematic side-view of a second exemplary embodiment of an electrical connector assembly 10' having a multilayer, interleaved structure, in accordance with the present invention. The electrical connector assembly 10' of FIG. 3 substantially corresponds to that shown in FIG. 1, but is configured as a so-called "zero insertion force" (ZIF) or "low insertion force" (LIF) connector assembly. The term "zero insertion force" is commonly used to refer to connector assemblies that allow initial engagement of mating connector structures with virtually no contact normal force. In other words, virtually no "interference" occurs upon engagement of connector layers 18, 26, 28 with gaps 44, 40, 42, respectively. The term "low insertion force" is commonly used to refer to connector assemblies that allow initial engagement of mating connector structures without a substantial amount of normal force at the contact surfaces, even though a small, nonzero amount of force may be necessary. A ZIF or LIF connector assembly typically includes a locking device designed to hold the connector structures together after initial engagement. Like connector assembly 10 of FIG. 1, connector assembly 10' of FIG. 3 is configured to enable stacked, interleaved engagement of connector layers 16, 18, 20, 26, 28. However, gaps 44, 40, 42 are dimensioned to have widths capable of accommodating insertion of first, fourth, and fifth connector layers 18, 26, 28, respectively, without a significant amount of force. The greater widths of gaps 40, 42, 44 avoid significant wiping contact between the major surfaces 36, 38 of interleaved connector layers 16, 18, 20, 26, 28. As a result, first connector structure 12' and second connector structure 14' can be easily engaged without a large amount of force, and can be characterized as either a ZIF or LIF connector assembly.

A biasing means is provided to impart a compressive force after initial engagement of first and second connector structures 12', 14'. The biasing means enhances electrical contact force between respective conductive contact surfaces 32, and acts as a locking device, ensuring separable, but structurally durable, engagement of connector structures 12', 14'. As shown in FIG. 3, the biasing means may comprise, for example, a frame 50 having an aperture through which first connector structure 12' extends. The aperture of frame 50 is dimensioned to define a gap 52 between an inside surface of the frame and second major surface 38 of third connector layer 20. A shuttle 54 is configured to slide into gap 52. In the example of FIG. 3, the shape of shuttle 54 is sloped, tapering outward from the narrowest point at the end received by gap 52 to the widest point at an opposite end. When shuttle 54 is slid into gap 52, the tapered surface of shuttle 54 engages the inside surface of frame 50 and applies force against both the inside surface and first connector structure 12'. The force applied by shuttle 54 results in a compressive force that biases first and third connector layers 16, 20 toward second connector layer 18. The shuttle 54 may include an elastomer or leaf spring to enhance the force applied to first connector structure 12'. When connector layers 18, 26, 28 engage gaps 44, 40, 42, respectively, the compressive force serves to hold interleaved connector assembly 10' together, and produce reliable electrical contact between respective conductive contact surfaces 32.

Figure 4:
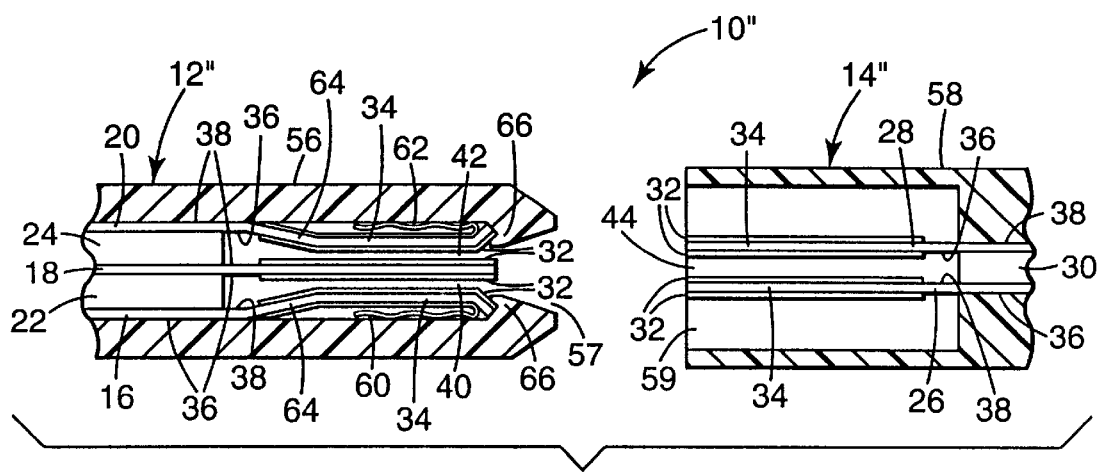
FIG. 4 is a schematic side-view of a third exemplary embodiment of an electrical connector assembly having a multilayer, interleaved structure, in accordance with the present invention.

FIG. 4 is a schematic side-view of a third exemplary embodiment of an electrical connector assembly 10" having a multilayer, interleaved structure, in accordance with the present invention. The connector assembly 10" of FIG. 4 substantially corresponds to connector assembly 10 of FIG. 1, but further includes a guide means for guiding engagement of first connector structure 12" and second connector structure 14". The guide means ensures precise horizontal alignment of respective conductive contact surfaces 32 coupled during engagement of connector structures 12", 14", and facilitates vertically aligned engagement between connector layer 16 and gap 44 and between connector layers 26, 28 and gaps 40, 42, respectively. As shown in FIG. 4, the guide means may comprise, for example, a socket housing 56, which houses first connector structure 12", and a header housing 58, which houses second connector structure 14". The socket housing 56 includes a first aperture 57 configured to receive connector layers 26, 28, whereas header housing 58 includes a second aperture 59 configured to receive connector layers 16, 18, 20, as well as the socket housing.

In connector assembly 10" of FIG. 4, connector layers 16 and 20 are attached to biasing means in the form of leaf springs 60, 62, respectively. The leaf springs 60, 62 are attached at the edge portions 34 of connector layers 16, 20 and produce a bend 64 in each of the flexible connector layers due to spring force. The springs 60, 64 exert compressive force against connector layers 16, 20, respectively, and against interior surfaces of socket housing 56. The resulting compressive force biases the respective edge portions 34 of connector layers 16, 20 toward the edge portion 34 of connector layer 18, thereby providing a compressive fit upon engagement of connector layers 18, 26, 28 with gaps 44, 40, 42, respectively. As shown in FIG. 4, the ends of connector layers 16, 20 can be held in locking channels 66 provided in socket housing 56 for stability and to avoid collisions with the ends of connector layers 26, 28. The socket housing 56 and header housing 58 can be made from molded plastic or metal, and can be configured with apertures 57, 59 having dimensions designed to provide a friction fit between the respective housings. If housings 56, 58 are made from metal, locking channels 66 should include insulation to prevent shorting of contact surfaces 32 carried by connector layers 16, 20. The friction fit complements the compressive fit of connector layers 16, 18, 20, 26, 28 and thereby further enhances structural durability of connector assembly 10".

Figure 5:
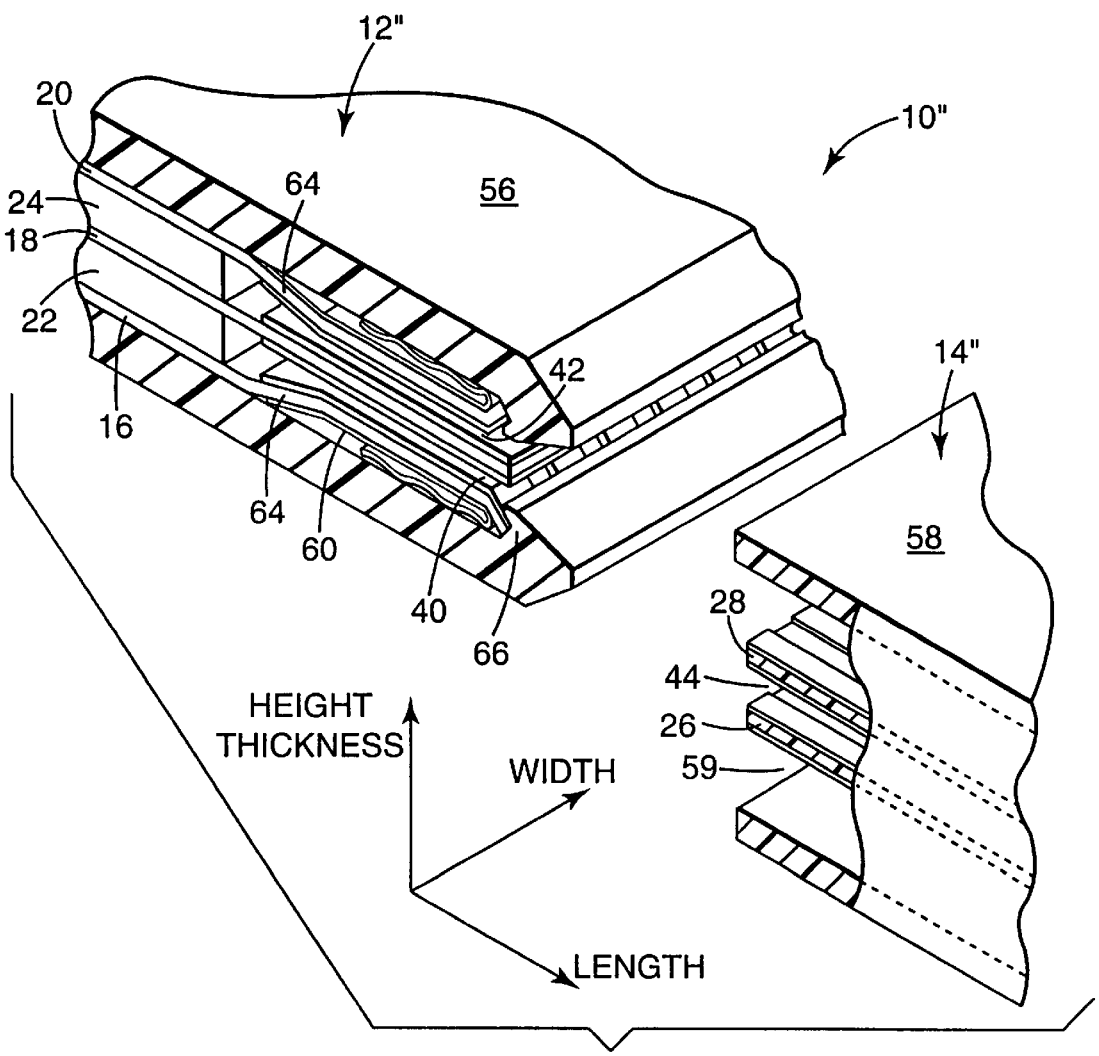
FIG. 5 is a partial schematic front perspective view of the electrical connector assembly shown in FIG. 3.

FIG. 5 is a partial schematic front perspective view of the electrical connector assembly 10" shown in FIG. 4. FIG. 5 provides a transverse view of apertures 57, 59 of socket housing 56 and header housing 58, respectively. As shown, aperture 57 is configured to accept connector layers 26, 28, whereas aperture 58 is configured to accept the entire socket housing 56.

Figure 6:
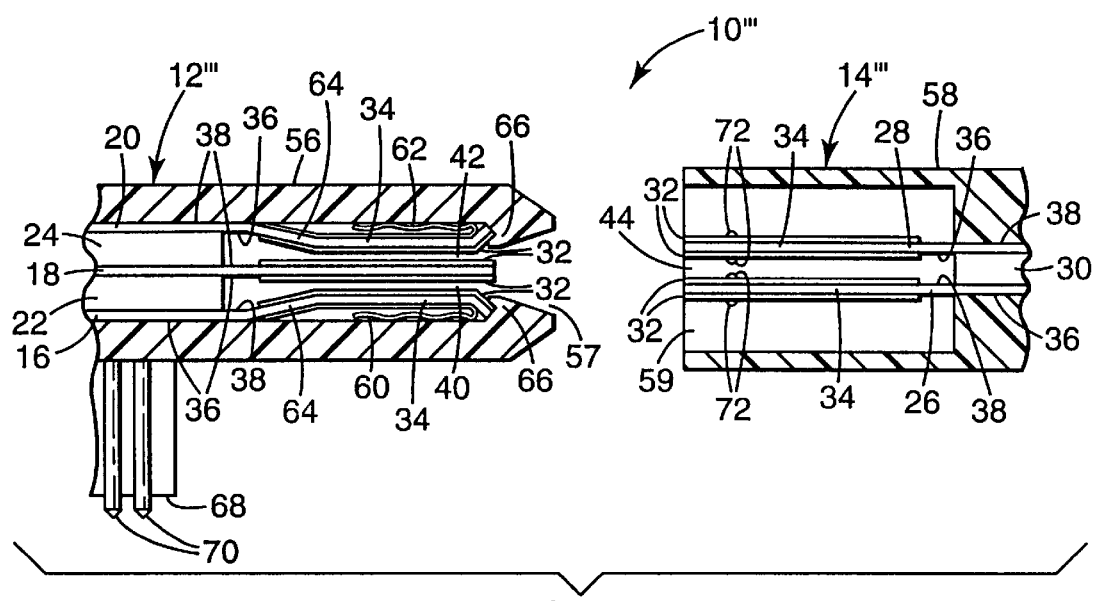
FIG. 6 is a schematic side-view of a fourth exemplary embodiment of an electrical connector assembly having a multilayer, interleaved structure, in accordance with the present invention.

FIG. 6 is a schematic side-view of a fourth exemplary embodiment of electrical connector assembly 10'" having a multilayer, interleaved structure, in accordance with the present invention. The connector assembly 10'" of FIG. 6 substantially corresponds to connector assembly 10" of FIG. 4, but illustrates other features that can be incorporated into the connector assembly. For example, contact bumps can be formed on one or more of the conductive contact surfaces 32 of connector layers 16, 18, 20, 26, 28. FIG. 6 shows contact bumps 72 formed on the contact surfaces 32 provided on both major surfaces 36, 38 of connector layers 26 and 28. However, contact bumps could be formed on a single major surface and on only selected connector layers, according to the situation. The contact bumps 72 concentrate, and thereby enhance, contact force between coupled contacts 32 of the interleaved connector layers 16, 18, 20, 26, 28. In addition, the contact bumps 72 may produce a torque, due to local conformability of mating contact surfaces 32, that yields better force uniformity.

The formation of high aspect ratio features (not shown), such as random points or asperities, on contact bumps 72 or directly on contact surfaces 32 also may be desirable to further enhance contact force. It is noted, however, that the formation of dendrites may be most suitable for ZIF or LIF connector assemblies such as that described with respect to FIG. 3. The high aspect ratio features can provide a z-axis wipe and enhance the contact surface area of the interconnection. The contact bumps 72 and/or high aspect ratio features can be formed on contact surfaces 32 by conventional techniques for the deposition of metals such as copper, tin, gold, or palladium nickel.

The connector assembly 10''' of FIG. 6 also illustrates the fabrication of one or both of connector structures 12''', 14''' as discrete connector structures designed for attachment to a printed circuit board or other electronic device. Fabrication of from fabrication of the connector structures as continuous connector structures such as printed circuit boards or flex circuits. FIG. 6 shows an example of the fabrication of connector structure 12 as a discrete connector structure mounted on a printed circuit board 68. The connector structure 12, including socket housing 56, can be both attached to printed circuit board 68 and electrically coupled to conductive traces in the printed circuit board via conductive pins 70. The connector layers 16, 18, 20 can be coupled to pins 70, and hence to the conductive traces in board 68, by interlaminate connections formed in connector structure 12'''. The conductive pins 70 can then be bonded to printed circuit board 68 and electrically coupled to conductive traces in the printed circuit board by conventional solder terminals formed in the board.

FIGS. 7–10 illustrate various additional embodiments of an electrical connector assembly having a multilayer, interleaved structure, in accordance with the present invention. The electrical connector assemblies shown in FIGS. 7–10 substantially correspond to those shown in FIGS. 1–6, but illustrate the fabrication of a connector assembly, in accordance with the present invention, using a smaller number of interleaved connector layers.

Figure 7:
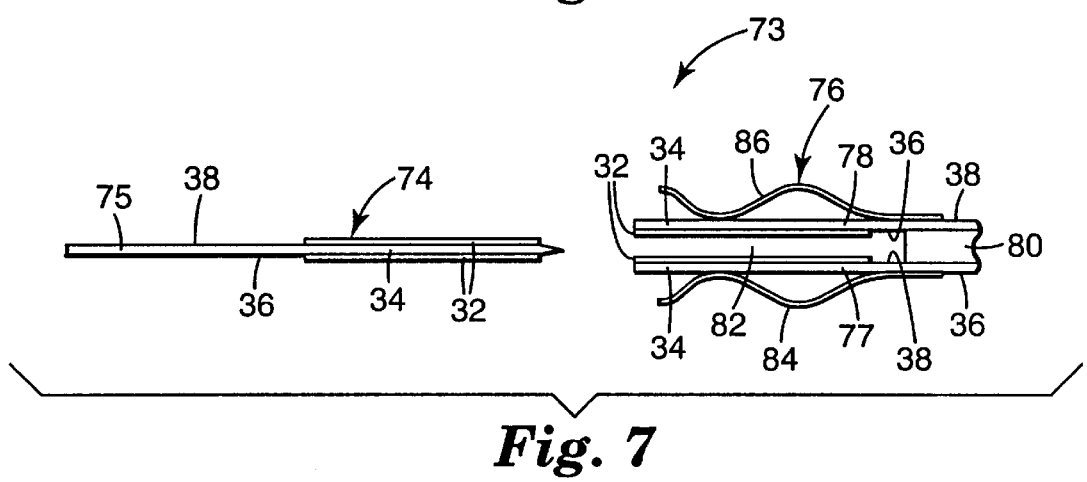
FIG. 7 is a schematic side-view of a fifth exemplary embodiment of an electrical connector assembly having a multilayer, interleaved structure, in accordance with the present invention.

With reference to FIG. 7, for example, a fifth exemplary embodiment of a connector assembly 73, in accordance with the present invention, includes a first connector structure 74 having a single, first connector layer 75, and a second connector structure 76 having a pair of stacked second and third connector layers 77, 78 separated by a separation layer 80. Again, the precise number of layers included in connector assembly 73 of FIG. 7 is purely exemplary, however, and amenable to increase or decrease according to desired interconnection densities. The second and third connector layers 77, 78 define a gap 82 therebetween adjacent the edge portions 34 of the second third connector layers. The gap 82 is substantially coplanar with separation layer 80. The first connector layer 75 is oriented to engage gap 82 upon engagement of first connector structure 74 and second connector structure 76. As in connector assembly 10 of FIG. 1, each of connector layers 75, 77, 78 includes a plurality of conductive contact surfaces 32 disposed along an edge portion 34 of the respective connector layer. Upon engagement of first connector layer 75 and gap 82, conductive contact surfaces 32 of the first connector layer are coupled to the conductive contact surfaces 32 of second and third connector layers 77, 78. Thus, conductive contact surfaces 32 can be provided on both a first major surface 36 and a second major surface 38 of connector layer 75. However, because only second major surface 38 of second connector layer 77 and first major surface 36 of third connector layer 78 engage first connector layer 75 via gap 42, conductive contact surfaces 32 need only be formed on those surfaces.

As in connector assembly 10 of FIG. 1, first, second, and third connector layers 75, 77, 78 of connector assembly 73 preferably include a material capable of resilient deformation, and may comprise thin, inexpensive printed circuit layers, such as printed circuit board layers or flex circuit layers. The resilience of connector layers 75, 77, 78 provides a compressive fit between first connector structure 74 and second connector structure 76 that enhances interconnection contact force and structural durability of connector assembly 73. Again, as in connector assembly 10 of FIG. 1, separation layer 80 does not fill gap 82, and therefore may be formed from a rigid material unless it is desired that the entire connector structure 76 be flexible. The second and third connector layers 77, 78 of second connector structure 76 can be held together by, for example, lamination to produce an integral, stacked construction accommodating interlaminate connections. Thus, second connector structure 76, as well as first connector structure 74, can be realized as either a discrete connector structure or a continuous printed circuit board or flex circuit, providing all of the interconnection functionality described above with respect to the connector assemblies of FIGS. 1–6.

In connector assembly 73 of FIG. 7, gap 82 preferably is dimensioned to have a width narrow enough to compressively engage first connector layer 75 upon insertion. The insertion of first connector layer 75 into gap 82 creates deformation forces that tend to bias second and third connector layers 77, 78 outward, away from the first connector layer. The resilient connector layers 77, 78 produce a resisting force, however, that tends to push the respective connector layers back toward their undeformed positions, and thus in an inward direction toward first connector layer 75. The resisting force imparts a compressive force to first connector layer 75 that provides a compressive fit to the interleaved connector structures 74, 76. This compressive force also provides a wiping action as connector layers 75, 77, 78 engage one another, as with connector assembly 10 of FIG. 1. A biasing means, in the form of leaf springs 84, 86, can also be provided on connector structure 76 to enhance contact force and structural durability of connector assembly 73. As shown in FIG. 7, leaf springs 84, 86 can be mounted on exterior surfaces of second connector structure 76 and oriented to bias second and third connector layers 77, 78, respectively, inward toward first connector layer 75.

Figure 8:
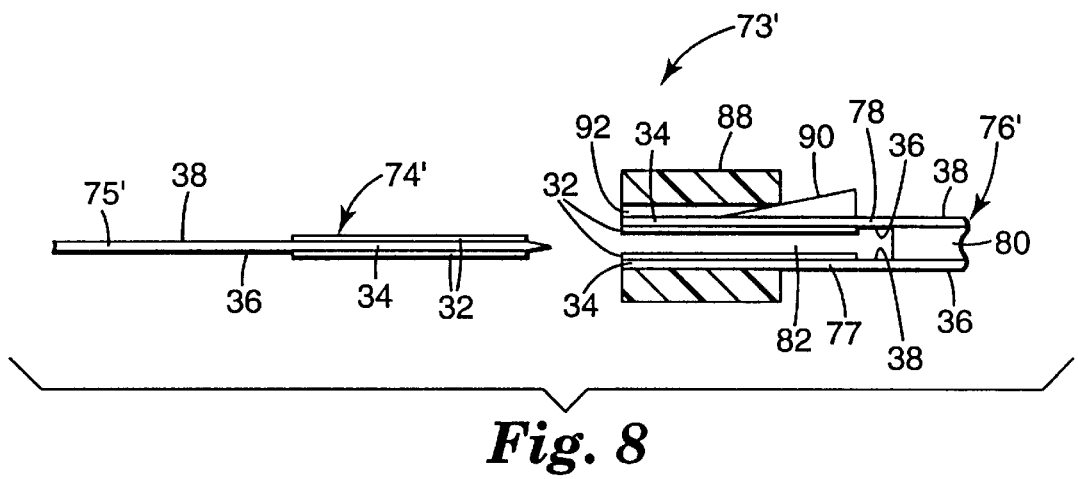
FIG. 8 is a schematic side-view of a sixth exemplary embodiment of an electrical connector assembly having a multilayer, interleaved structure, in accordance with the present invention.

FIG. 8 is a schematic side-view of a sixth exemplary embodiment of an electrical connector assembly 73' having a multilayer, interleaved structure, in accordance with the present invention. The electrical connector assembly 73' of FIG. 8 substantially corresponds to that shown in FIG. 7, but is configured as a "zero insertion force" connector assembly. Like connector assembly 10' of FIG. 3, connector assembly 73' of FIG. 8 has a gap 82 dimensioned to have a width capable of accommodating insertion of second connector layer 75 without a significant amount of force. A biasing means, in the form of frame 88 and shuttle 90 is provided to impart a compressive force after initial engagement of first and second connector structures 74', 76'. As in connector assembly 10' of FIG. 3, the biasing means for connector assembly 73' of FIG. 8 enhances electrical contact force between respective conductive contact surfaces 32, and acts as a locking device, ensuring separable, but structurally durable, engagement of connector structures 74', 76'. As shown in FIG. 8, frame 88 has an aperture through which second connector structure 76' extends. The aperture of frame 88 is dimensioned to define a gap 92 that receives shuttle 90. When shuttle 90 is slid into gap 92, the tapered surface of the shuttle applies force against both the inside surface of the shuttle and second connector structure 76'. The force applied by shuttle 90 provides a compressive force that biases second and third connector layers 77, 78 toward first connector layer 75, thereby holding connector structures 74', 76' together and ensuring reliable electrical contact.

Figure 9:
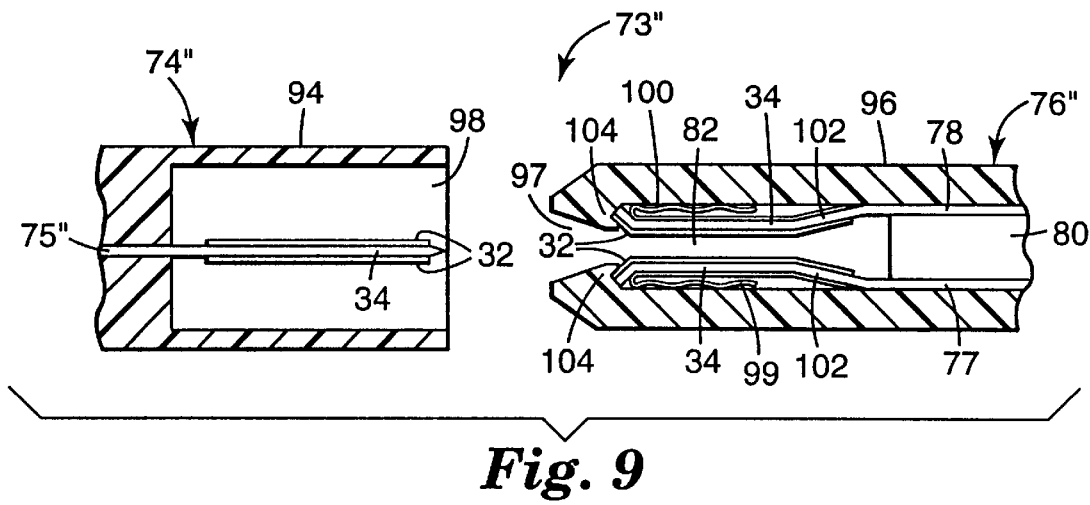
FIG. 9 is a schematic side-view of a seventh exemplary embodiment of an electrical connector assembly having a multilayer, interleaved structure, in accordance with the present invention.

FIG. 9 is a schematic side-view of a seventh exemplary embodiment of an electrical connector assembly 73'' having a multilayer, interleaved structure, in accordance with the present invention. The connector assembly 73″ of FIG. 9 substantially corresponds to connector assembly 73 of FIG. 7, but, like connector assembly 10″ of FIG. 4, further includes a guide means, in the form of header housing 94 and socket housing 96, for guiding engagement of first connector structure 74″ and second connector structure 76″. As shown in FIG. 9, socket housing 96 includes an aperture 97 configured to receive first connector layer 75, and header housing 94 includes an aperture 98 configured to receive second and third connector layers 77, 78, as well as the socket housing. The second and third connector layers 77, 78 are attached to biasing means in the form of leaf springs 99, 100, respectively. The leaf springs 99, 100 are attached at the edge portions 34 of connector layers 77, 78 and produce a bend 102 in each connector layer due to spring force. The ends of connector layers 77, 78 adjacent bend 102 are held in locking channels 104 provided in socket housing 96. The springs 99, 100 exert compressive force against connector layers 77, 78 that biases the respective edge portions 34 of the second and third connector layers toward the edge portion 34 of first connector layer 75. The springs 99, 100 enhance the compressive fit produced upon engagement of the first connector layer 75 with gap 82.

Figure 10:
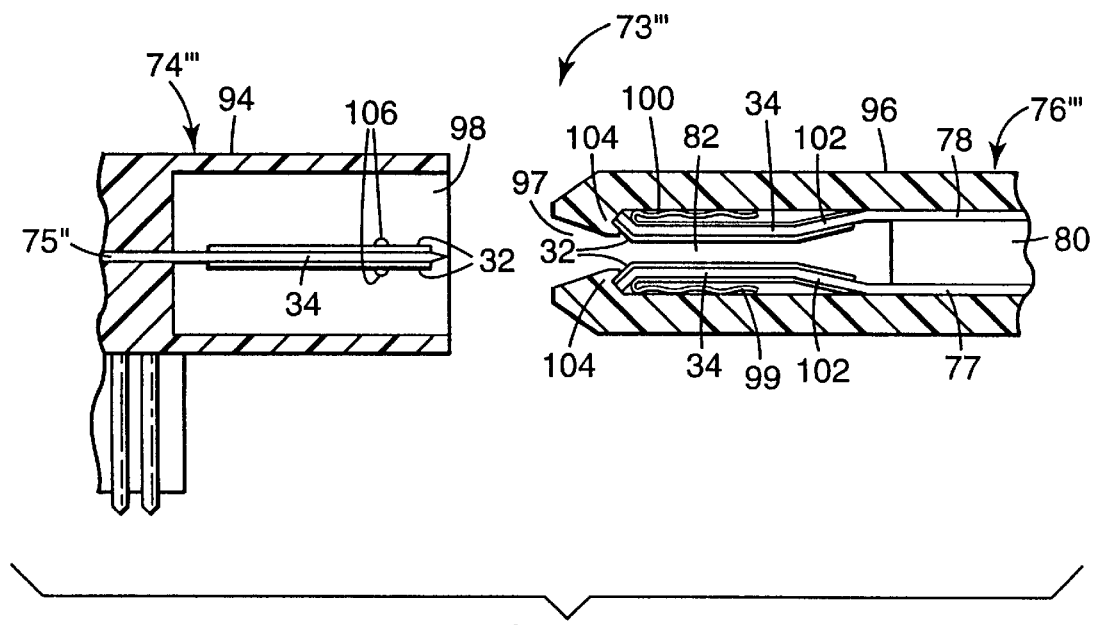
FIG. 10 is a schematic side-view of an eighth exemplary embodiment of an electrical connector assembly having a multilayer, interleaved structure, in accordance with the present invention.

FIG. 10 is a schematic side-view of an eighth exemplary embodiment of an electrical connector assembly 73′″ having a multilayer, interleaved structure, in accordance with the present invention. The connector assembly 73′″ of FIG. 10 substantially corresponds to connector assembly 73″ of FIG. 9, but illustrates the incorporation of contact bumps 106, formed on the conductive contact surfaces 32 of one or more of connector layers 75, 77, 78, and the mounting of at least one of connector structure 74′″, 76′″ on a printed circuit board 108. For example, FIG. 10 shows contact bumps 106 formed on the contact surfaces 32 provided on both major surfaces 36, 38 of first connector layer 75, for concentrating contact force. FIG. 10 also shows an example of the fabrication of connector structure 73′″ as a discrete connector structure mounted on a printed circuit board 108 via conductive pins 109. The conductive pins 109 can be both mechanically coupled to printed circuit board 108 and electrically coupled to conductive traces in the printed circuit board by conventional solder terminals, and coupled to connector layer 75 via interlaminate connections.

Figure 11:
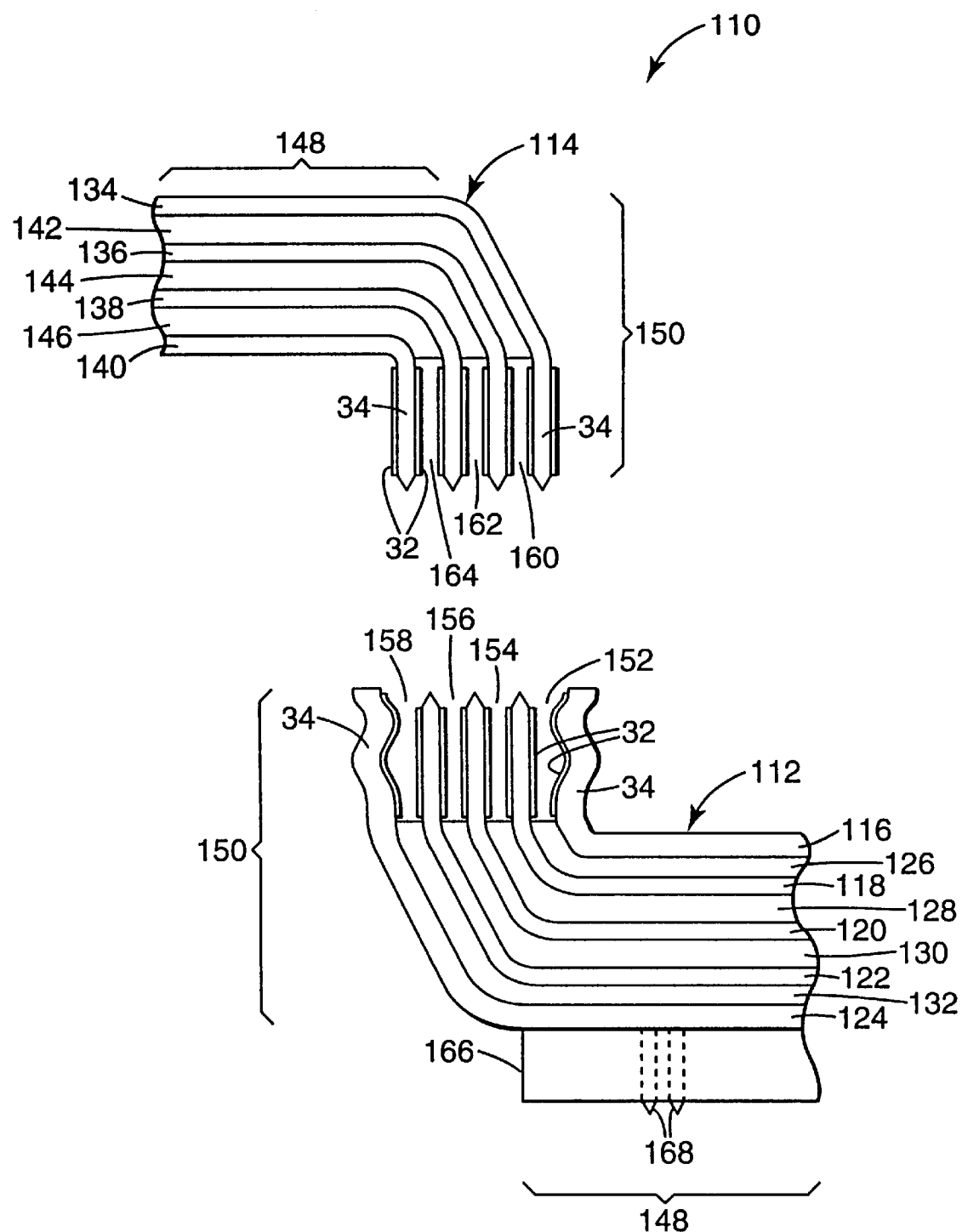
FIG. 11 is a schematic side-view of a ninth exemplary embodiment of an electrical connector assembly having a multilayer, interleaved structure, in accordance with the present invention.

FIG. 11 is a schematic side-view of a ninth exemplary embodiment of an electrical connector assembly 110 having a multilayer, interleaved structure, in accordance with the present invention. The electrical connector assembly 110 includes a first connector structure 112 and a second connector structure 114. The connector structures 112, 114 in FIG. 11 are depicted as having a high number of connector layers and separation layers, and thus illustrate the vast interconnection densities that can be achieved by an electrical connector assembly constructed according to the present invention. Once again, the precise number of layers included in connector assembly 110 is purely exemplary, however, and amenable to increase or decrease according to desired interconnection densities. The first connector structure 112, in the example of FIG. 11, includes first, second, third, fourth, and fifth connector layers 116, 118, 120, 122, and 124, and first, second, third, and fourth separation layers 126, 128, 130, and 132. The second connector structure 114 similarly includes sixth, seventh, eighth, and ninth connector layers 134, 136, 138, and 140, and fifth, sixth, and seventh separation layers 142, 144, and 146.

In the example of FIG. 11, the various connector layers and separation layers have first portions, indicated by bracket 148, and second portions, indicated by bracket 150, which are bent to extend at an angle relative to first portions 148. The second portions indicated by bracket 150 include the edge portions 34 of the various connector layers. In FIG. 11, second portions 150 of connector layers 116–124 and 134–140 extend substantially perpendicular to first portions 148. However, the connector layers can be bent at any angle to achieve desired interconnection orientations. The bend, at whatever angle, preferably is made about a radius sufficient to avoid damage, such as cracking, to the connector layers, contact surfaces, and conductive traces.

In first connector structure 112, first portions 148 of connector layers 116, 118, 120, 122, 124 and separation layers 126, 128, 130, 132 are held together by, for example, lamination, to form a multilayer stack. Similarly, in second connector structure 114, first portions 148 of connector layers 134, 136, 138, 140 and separation layers 142, 144, 146 are held together to form a multilayer stack. The second portions 150 of the various connector layers define a series of parallel gaps. The various separation layers are substantially coplanar with respective gaps, but stop short of edge portions 34, leaving space between adjacent connector layers. In first connector structure 112, for example, the edge portions 34 of first and second connector layers 116, 118 define a first gap 152, the edge portions 34 of second and third connector layers 118, 120 define a second gap 154, the edge portions 34 of third and fourth connector layers 120, 122 define a third gap 156, and the edge portions 34 of fourth and fifth connector layers 122, 124 define a fourth gap 158. Similarly, in second connector structure 114, the edge portions 34 of sixth and seventh connector layers 134, 136 define a fifth gap 160, the edge portions 34 of seventh and eight connector layers 136, 138 define a sixth gap 162, and the edge portions 34 of eight and ninth connector layers 138, 140 define a seventh gap 164.

As in connector assemblies 10, 73 shown throughout FIGS. 1–10, each of connector layers 116–124 and 134–140 includes conductive contact surfaces 32 disposed adjacent edge portions 34 of the respective connector layers. Each of connector layers 134–140 in second connector structure 114 may include contact surfaces 32 on both major surfaces 36, 38 of the respective edge portions 34. Only the interior connector layers 118, 120, 122 of first connector structure 112 should have contact surfaces 32 on both major surfaces 36, 38, however, because first connector layer 116 and fifth connector layer 124 make contact with mating connector layers only on the interior major surface of the first connector layer and the interior major surface of the second connector layer. Each of connector layers 116–124 and 134–140 preferably includes a material capable of resilient deformation, and can be realized by a printed circuit board layer or flex circuit layer laminated in a deformed state to produce the fixed bend structure shown in FIG. 11. The outer connector layers 116, 124 of first connector structure 112 can be molded with an integral spring form and/or provided with a resilient backing material to produce a natural biasing means that resists forces pushing the connector layers 116, 124 away from interior connector layers 118–122.

One or both of first and second connector structures 112, 114 can be constructed as a continuous printed circuit board or flex circuit with an integral, mating connector structure. Alternatively, connector structures 112, 114 can be constructed as discrete connector structure mounted on an edge of or otherwise coupled to a continuous printed circuit board or a continuous flex circuit. For example, first connector structure 112 is shown in FIG. 11 as a discrete connector structure mounted on the edge of a printed circuit board 166.

The conductive traces in each connector layer can be coupled to traces on board 166 by interlaminate connections and conductive pins 168. The first and second connector structures 112, 114 may also be constructed as discrete connector structures appropriate for connection to the end of a cable.

Upon engagement of first connector structure 112 and second connector structure 114, the edge portions 34 of second, third, and fourth connector layers 118, 120, 122 are oriented to engage fifth, sixth, and seventh gaps 160, 162, 164, respectively. At the same time, the edge portions 34 of sixth, seventh, eighth, and ninth connector layers 134, 136, 138, 140, respectively are oriented to engage first, second, third, and fourth gaps 152, 154, 156, 158, respectively. As a result of interleaved engagement of connector layers 116–124 and 134–140, the conductive contact surfaces 32 carried by each of the connector layers is mated with a corresponding contact surface 32 on another connector layer, thereby effecting a plurality of interconnections between first and second connector structures 112, 114.

The gaps 152–164 can be dimensioned for an interference fit, having widths narrow enough to compressively engage the interleaved connector layers upon insertion, producing wiping contact and deformation forces. The resilient connector layers 77, 78 respond to the deformation forces by producing resisting forces that tend to impart a compressive fit to the interleaved connector assembly 110 in the manner described above with respect to the embodiments of FIGS. 1–10. In addition, the natural biasing force provided by connector layers 116, 124 provides additional compression to ensure reliable electrical contact and durable engagement. Although connector assembly 10 is described above as including shaped connector layers 116, 124 and narrow gaps, the assembly could be readily configured as a zero insertion force or low insertion force assembly by widening the gaps and providing an external biasing means such as a set of springs or a frame and shuttle arrangement.

Figure 12:
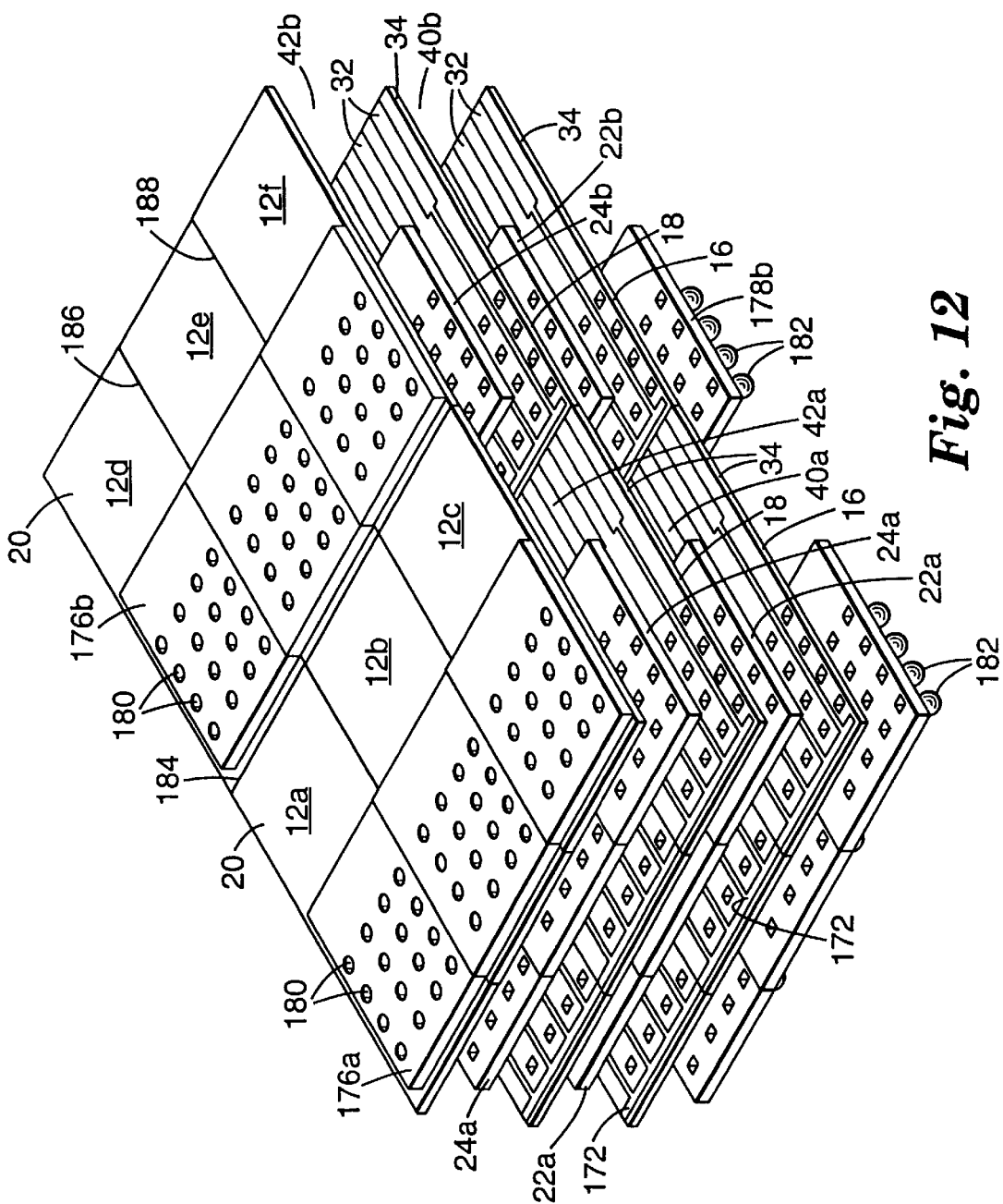
FIG. 12 illustrates a method for fabricating an electrical connector assembly having a multilayer, interleaved structure, in accordance with the present invention.

FIG. 12 illustrates a method for fabricating an electrical connector assembly having a multilayer, interleaved structure, in accordance with the present invention. Although a single connector structure can be readily constructed on an individual basis, the method enables the simultaneous fabrication of a plurality of connector structures using a series of common steps. FIG. 12 illustrates the simultaneous fabrication of a plurality of connector structures 12a, 12b, 12c, 12d, 12e, 12f by sectioning a stacked connector structure 170. Each of connector structures 12a–12f resembles, for example, first connector structure 12 shown in FIG. 1. This method can be applied, however, to form both the first connector structure and second connector structure of an electrical connector assembly, in accordance with the present invention, and is readily applicable to any of the exemplary embodiments described above with respect to FIGS. 1–11. For ease of illustration, FIG. 12 and the following description refer to the fabrication of only one of the connector structures of the electrical connector assembly of the present invention With reference to FIG. 12, stacked structure 170 is formed by providing a first connector layer 16, a second connector layer 18, and a third connector layer 20. The first, second, and third connector layers 16, 18, 20 preferably include a material capable of resilient deformation. A plurality of conductive contact surfaces 32 and conductive traces 35 are formed in each of a plurality of regions of first, second, and third connector layers 16, 18, 20. The conductive traces may include bus bars 172 for continuity testing. In addition, a plurality of guide patterns 174 can be provided for the formation of contact pads used for coupling the connector structure to an external circuit via through-holes. The regions correspond to discrete connector structures 12a–12f that will be formed as a result of the method. It is noted, however, that each of connector structures 12a–12f may comprise integral portions of a continuous printed circuit board or flex circuit. A plurality of separation layers 22a, 22b, 24a, 24b are provided, and placed between connector layers 16, 18, 20 to form stacked structure 170. Specifically, separation layers 22a and 22b are placed between connector layers 16 and 18, and separation layers 24a and 24b are placed between connector layers 18 and 20.

Separation layers 22a, 24a are spaced from separation layers 22b, 24b and aligned with a portion of connector structures 12a, 12b, and 12c. Separation layers 22b, 24b are aligned with a portion of connector structures 12d, 12e, 12f. The first and second connector layers 16, 18 define gaps 40a, 40b therebetween. Gap 40a corresponds to connector structures 12a, 12b, 12c, whereas gap 40b corresponds to connector structures 12d, 12e, 12f. Similarly, second and third connector layers 18, 20 define gaps 44a, 44b therebetween. Gaps 42a, 42b correspond to connector structures 12a, 12b, 12c and connector structures 12d, 12e, 12f, respectively. In addition, the gaps 40a, 40b, 42a, 42b are positioned such that conductive contact surfaces 32 remain accessible. Separation layers 22a, 22b extend substantially coplanar with gaps 40a, 40b, whereas separation layers 24a, 24b extend substantially coplanar with gaps 42a, 42b. The separation layers 22a, 22b, 24a, 24b stop short of the edge portions 34 of the respective connector structures 12a–12f, however, thereby leaving space for gaps 40a, 40b, 42a, 42b.

Additional dielectric layers 176a, 176b, 178a, 178b can be added to stacked structure 170 to enable the formation of hardware necessary for coupling connector structures 12a–12f to electronic devices, such as printed circuit boards. As shown in FIG. 12, layers 176a, 178a correspond to connector structures 12a–12c, whereas layers 176b, 178b correspond to connector structures 12d–12f. Layers 176a, 176b may include a plurality of guide holes 180 for the formation of through-holes aligned with contact guide patterns 174. Selected guide holes 180 can be drilled out to form through-holes, into which a plurality of conductive pins can be inserted to interconnect conductive traces 35 on different layers of connector structures 12a–12f. Layers 178a, 178b may include a plurality of solder bumps 182, or other conventional coupling means, for coupling the connector structures 12a–12f to terminals on a printed circuit board.

Figure 13:
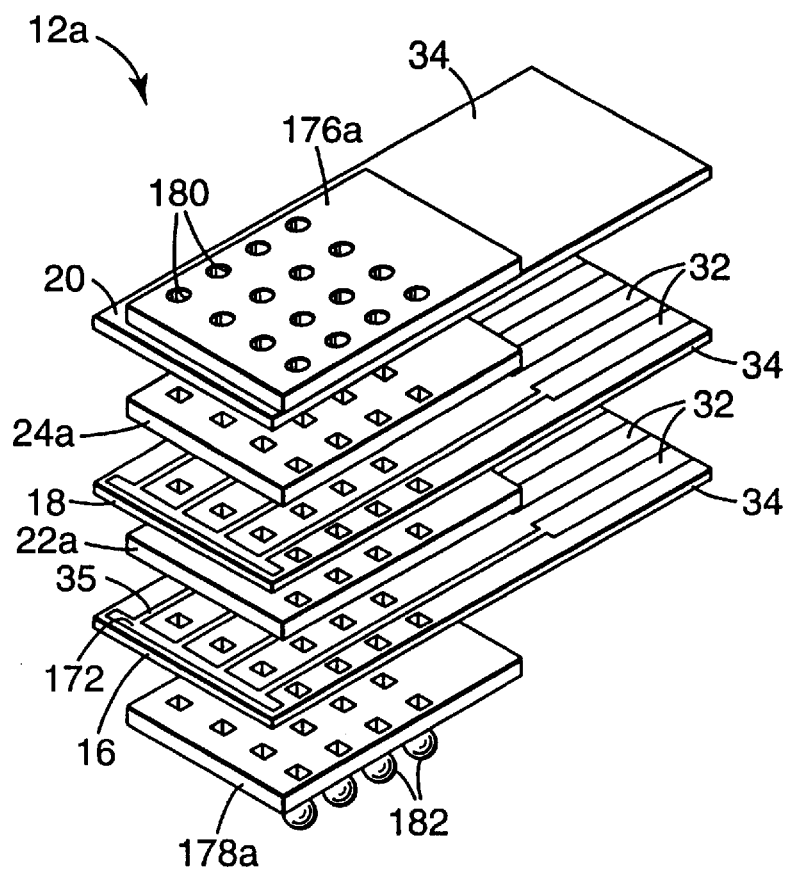
FIG. 13 is a schematic top perspective view of an exemplary electrical connector assembly fabricated according to the method illustrated in FIG. 12.

The resulting stacked structure 170 can be held together, for example, by lamination. Once stacked structure 170 is assembled, as described above, sections of the stacked structure are separated to form discrete connector structures 12a, 12b, 12c, 12d, 12e, and 12f. In the example of FIG. 12, stacked structure 170 can be cut across a line 184 and a pair of lines 186, 188 to produce six sections. Each section provides a single connector structure 12a, as shown in FIG. 13. The number of connector structures produced by this method is, of course, subject to variation according to the needs of the user. For any number, however, this method can substantially reduce the complexity and number of steps necessary to form the electrical connector assembly of the present invention.

The following examples are provided to illustrate an electrical connector assembly, in accordance with the present invention, and, in particular, exemplary techniques for fabricating such a connector assembly. Reference to various glass filled epoxy printed circuit board substrates and metal-glass filled polymer laminates in the following examples are intended to generally conform to Military Specification MIL-S-13949H, effective Dec. 24, 1992.

EXAMPLE 1

A single, discrete electrical connector assembly conforming substantially to connector assembly 10 of FIG. 1 was constructed using the following technique. Each of connector layers 16, 20 was fabricated by providing a single printed circuit board layer made of ED130 difunctional epoxy laminate having a 1080 glass-style prepreg, grade ED2. The ED2 connector layers 16, 20 each had a thickness of approximately 0.0025 inches (635 μm), a width of approximately 1.6 inches (4.064 cm), and a length of approximately 0.75 inches (1.9 cm). FIG. 4 includes a set of axes illustrating, as a point of reference, the directions in which thickness, width, and length of connector assembly 10 were measured. One side of each of the ED2 connector layers 16, 20 was cured to an oxide-treated side of a one ounce copper foil having a thickness of approximately 0.00135 inches (34.3 μm). The lamination was cured between Tedlar™ release liners under 200 psi (1.4 MPa) pressure in a lab press set at 300° F. (149° C.) for approximately one hour. The Tedlar™ release liners are commercially available from E. I. Dupont Company, of Buffalo, N.Y. The thickness and length of each of connector layers 16, 20, including the copper, produced a thin beam aspect ratio of approximately 56:1.

Each of connector layers 18, 26, 28 was fabricated with a printed circuit board layer made from a standard 6/cl/cl ED130 epoxy glass laminate having a thickness of approximately 0.006 inches (152.4 μm), with one ounce c-class copper having a thickness of approximately 0.00135 inches (34.3 μm) on opposite sides. The overall 6/cl/cl connector layers 18, 26, 28, including the copper, each had a thickness of approximately 0.0087 inches (221 μm), a width of approximately 1.6 inches (4.1 cm), and a length of approximately 0.75 inches (1.9 cm). The thickness and length of each of connector layers 18, 26, 28, including the copper, produced a thin beam aspect ratio of approximately 27:1.

Conductive contact surfaces 32 and conductive traces 35 were formed by patterning and etching the copper on connector layers 16, 18, 20, 26, 28. The conductive contact surfaces 32 were formed at an edge portion 34 of the respective connector layer and extended generally parallel to one another along the width of the connector layer. Signal carrying layers having a plurality of contact surfaces 32 were formed on the copper laminated to connector layers 16, 18, 20, 26, 28. The contact surfaces 32 had the following approximate dimensions: 0.050 inch (1.27 mm) centers, 0.030 inch (0.762 mm) stripes, and 0.40 inch (1.016 cm) lengths. The conductive traces 35 had the following dimensions: 0.050 inch (1.27 mm) centers, 0.010 inch (0.254 mm) wide stripes, and 0.30 inch (0.762 mm) lengths.

Each of separation layers 22, 24, and 30 was fabricated by a dielectric layer of 6/00/00 ED130 difunctional epoxy laminate, having a thickness of approximately 0.006 inches (152.4 μm), sandwiched between two bonding sheets of 108 glass style, low flow prepreg, grade A11, each having a thickness of approximately 0.003 inches (76.2 μm). The structure produced by the laminate and the bonding sheets was trimmed into strips having widths of approximately 1.6 inches (4.064 cm) and lengths of approximately 0.40 inches (1.016 cm). The resulting separation layers 22, 24, 30 were placed between adjacent connector layers such that each separation layer extended along only a portion of the length of a respective connector layer, leaving gaps 40, 42, 44, as shown in FIG. 1, by which contact surfaces 32 could be accessed. The separation layers 22, 24 and connector layers 16, 18, 20 were stacked to produce first connector structure 12, whereas separation layer 30 and connector layers 26, 28 were stacked to produce second connector structure 14.

All of the above-mentioned laminate materials used for construction of connector layers 16, 18, 20, 26, 28 and separation layers 22, 24, 30, except for the release liners, were obtained from Allied Signal Laminate Systems of LaCrosse, Wis.

The first and second connector structures 12, 14 were laminated under 150 psi pressure (1.03 MPa] at 300° F. (149° C.), with a two-hour ramp to temperature, and one-half hour at temperature. The lamination layup for first connector structure 12, in stacked order from top to bottom, comprised:

aluminum press plate
release liner
rubber press sheets
release liner
ED2 connector layer } connector layer 20
one ounce copper with etched signal layer 4
grade A11 bonding sheet
6/00/00 ED130 layer } separation layer 24
grade A11 bonding sheet
one ounce copper with etched signal layer 3
6/c1/c1 ED130 connector layer } connector layer 18
one ounce copper with etched signal layer 2
grade A11 bonding sheet
6/00/00 ED130 layer } separation layer 22
grade A11 bonding sheet
one ounce copper with etched signal layer 1 } connector layer 16
ED2 connector layer
release liner
rubber press sheets
release liner
aluminum press plate The lamination lay-up for second connector structure 14, in stacked order from top to bottom, comprised:

aluminum press plate
release liner
rubber press sheets
release liner
one ounce copper with etched signal layer 1
6/c1/c1 ED130 connector layer } connector layer 28
one ounce copper with etched signal layer 2
grade A11 bonding sheet
6/00/00 ED130 layer } separation layer 30
grade A11 bonding sheet
one ounce copper with etched signal layer 3
6/c1/c1 ED130 connector layer } connector layer 26
one ounce copper with etched signal layer 4
release liner
rubber press sheets
release liner
aluminum press plate The resulting connector assembly 10, upon interleaved engagement of first connector structure 12 and second connector structure 14, had a profile of approximately 0.045 inches (1.143 mm), a footprint of approximately 1.0 inches (2.54 cm)×1.5 inches (3.81 cm), an interconnection area density of approximately 80 contact pairs per square inch (0.124 contact pairs per square mm), and interconnection volume density of approximately 1778 contact pairs per cubic inch (0.10849 contact pairs per cubic mm). An electrical continuity of less than 0.1 ohms (the limits of the ohm-meter used) was measured for most contact pairs when connector assembly 10 was loaded with an externally applied 1.5 kg normal force.

EXAMPLE 2

A single, discrete electrical connector assembly conforming substantially to connector assembly 10''' of FIG. 4 was constructed substantially as described with respect to Example 1. However, a socket housing 56 and a header housing 58 were added to connector assembly 10'''. The socket housing 56 and header housing 58 were formed by stereolithography using an epoxy material comprising Ciba Geigy SL5170. The socket housing 56 had a width of approximately 1.60 inches (4.064 cm), a height of approximately 0.225 inches (5.72 mm), a length of approximately 0.75 inches (1.905 cm), and top, bottom, and side walls having thicknesses of approximately 0.050 inches (1.27 mm). The aperture 57 provided in socket housing 56 had a height of approximately 0.055 inches (1.40 mm) and a width of approximately 1.5 inches (3.81 cm). During the stereolithography process, locking channels 66 were formed adjacent aperture 57 of socket housing 56. The header housing 58 had a width of approximately 1.72 inches (4.368 cm), a height of approximately 0.325 inches (8.255 mm), a length of approximately 0.70 inches (1.778 cm), and top, bottom, and side walls having thicknesses of approximately 0.050 inches (1.27mm). The aperture 59 provided in header housing 58 had a height of approximately 0.22 inches (5.588 mm) and a width of approximately 1.6 inches (4.064 cm).

Leaf springs 60, 62 were formed from 0.003 inch (76.2 $\mu$m) thick 0.5/0.5 hardened stainless spring steel. The spring steel was cut into coupons, each having a surface area of approximately 1.50 inch (3.81 cm) by 0.50 inch (1.27 cm). The spring steel coupons were pressed in a corrugated die to form a corrugated region in a 0.20 inch (5.08 mm) long strip along the 1.5 inch (3.81 cm) width in each coupon. The corrugated region of each coupon measured approximately 0.016 inches (406.4 $\mu$m) in thickness. Each coupon was bent in a vice to form a sharp bend approaching 180° at the beginning of the corrugated region. The uncorrugated region of each of leaf springs 60, 62 was then bent toward the corrugated region to form a leaf spring measuring approximately 0.050 inches (1.27 cm) in thickness. The uncorrugated region was bonded to the exterior surfaces of connector layers 16, 20, respectively, with 3M VHB 9460 adhesive having a thickness of approximately 0.002 inches (50.8 $\mu$m).

The first connector structure 12, including connector layers 16, 18, 20, separation layers 22, 24, and springs 60, 62 was inserted into socket housing 56 and affixed therein with adhesive. The ends of connector layers 16, 20 were bent into place in locking channels 66. The second connector structure 14, including connector layers 26, 28, and separation layer 30, similarly was inserted into header housing 58 and affixed therein with adhesive. The connector layers 26, 28 in header housing 58 were biased outward by inserting a 0.006 inch (152 $\mu$m) shim and working the shim back and forth to create a slightly opened shape to better accommodate insertion of connector layer 18 upon interleaved engagement. Total interference between the interleaved connector layer and the socket and header housings 56, 58 was roughly:

---

−0.120 inches (3.043 mm) for gap in socket housing +
0.123 inches (3.1242 mm) for layers and springs in socket housing +
0.018 inches (0.4572 mm) for layers in header housing =

---

0.021 inches (0.5334 mm) for total interference during insertion

---

The resulting connector assembly 10''', upon engagement of first connector structure 12 and second connector structure 14, had a height of approximately 0.325 inches (8.255 mm), a footprint of approximately 1.0 inches (2.54 cm)× 1.71 inches (4.343 cm), a contact area density of approximately 70.2 contact pairs per square inch (0.10878 contact pairs per square mm), a contact volume density of approximately 216 contact pairs per cubic inch (0.01318 contact pairs per cubic mm), and electrical continuity of less than 0.1 ohms (the limits of the ohm-meter used) for all contact pairs.

EXAMPLE 3

A single, discrete electrical connector assembly conforming substantially to connector assembly 73 of FIG. 7, but further including an integral spring molded into connector layer 77, was constructed according to the following technique. Connector layer 75 was fabricated with a printed circuit board layer made from a standard 6/cl/cl ED130 epoxy glass laminate having a thickness of approximately 0.006 inches (152.4 $\mu$m), with one ounce c-class copper having a thickness of approximately 34.3 $\mu$m on opposite sides. The overall 6/cl/cl connector layer 75, including the copper, had a thickness of approximately 0.009 inches (228.6 $\mu$m), a length of approximately 0.5 inches (1.27 cm), and a width of approximately 1.5 inches (3.81 cm). Connector layer 78 was fabricated by providing a single printed circuit board layer made of FR-4 core ED130 epoxy glass laminate having a thickness of approximately 0.030 inches (0.762 mm), with one ounce c-class copper having a thickness of approximately (34.3 $\mu$m) on one side. The overall connector layer 78, including the copper, had a thickness of approximately 0.0314 inches (0.7976 mm), a length of approximately 1.0 inches (2.54 cm), and a width of approximately 1.5 inches (3.81 cm). Conductive contact surfaces 32 and conductive traces 35 were formed by patterning and etching the copper on connector layers 75, 78.

Connector layer 77 was formed by a series of steps involving connector layer 78. First, a layer of FR-4 core ED130 epoxy glass laminated having a thickness of approximately 0.010 inches (0.254 mm) was cut to a length of approximately 0.55 inches (14.0 mm) and a width of approximately 1.5 inches (3.81 cm) to form separation layer 80. The separation layer 80 was placed on top of connector layer 78, with a 108 bonding sheet placed between the two layers. A 108 bonding sheet was then placed on top of separation layer 80. The separation layer 80 was dimensioned to leave a gap 82. However, a steel rule, 0.021 inches (0.533 mm) thick, covered on each side by a Tedlar™ release liner, was inserted into the gap 82, leaving a space between the steel rule and separation layer 80. The release liner covered both the steel rule and the space to ensure minimum separation of contact surfaces 32 on opposite sides of the space. Connector layer 77 was then formed by placing a 1080 prepreg, which had been bonded and cured to a layer of one ounce copper having a thickness of approximately 34.3 $\mu$m on one side, over separation layer 80, the steel rule, and the space, and by placing three layers of 2116 prepreg over the 1080 prepreg.

All of the above-mentioned laminate materials used for construction of connector layers 16, 18, 20, 26, 28 and separation layers 22, 24, 30, except for the release liners, were obtained from Allied Signal Laminate Systems of LaCrosse, Wis.

The resulting assembly was placed in a press with three press cushion pads, and Tedlar™ release liners, over the top of the assembly. The lamination layup of the assembly, in stacked order from top to bottom, comprised:

--- aluminum press plate
release layer
press cushion pad
press cushion pad
press cushion pad
release layer
2116 prepreg      ⎫
2116 prepreg      ⎬
2116 prepreg      ⎬ connector layer 77
1080 prepreg      ⎬
one ounce copper  ⎭
release liner      release liner      bonding sheet
steel rule         space              FR-4 separation layer 80
release liner      release liner      bonding sheet
0.030 inch FR-4 connector layer 78

-continued

```
release liner
aluminum press plate
```

The assembly was placed under approximately 300 psi (2.07 MPa) pressure and heated at approximately 300° F. (149° C.) for forty-five minutes. Upon heating with pressure applied, the 2116 and 1080 prepregs softened and conformed somewhat to the shape of the space between the steel rule and separation layer 80. Eventually, the 2116 and 1080 prepregs cured, creating a strong bond.

After cooling, the assembly was removed from the press. After removal of the release liners and the steel rule, the cured assembly produced a second connector structure 14. The second connector structure 14 was observed to retain a bend in connector layer 77, providing an integral spring form. Upon interleaved engagement of first connector structure 12, comprising connector layer 75, and second connector structure 14, comprising connector layers 77, 78 and separation layer 80, the integral spring form provided gap 82 with an interference fit. The interference fit, upon insertion of connector layer 75 into gap 82, caused deformation of connector layer 77. Connector layer 77, with its intrinsic resilience and integral spring form, acted in response to the deformation with a force tending to bias connector layer 77 toward connector layer 78, providing a compressive fit with connector layer 75. The compressive fit produced good electrical contact force. Resistance between mating contact surfaces 32 of connector layers 75, 77, 78 was measured to be less than 0.1 ohms (the limits of the ohm-meter used).

The resulting connector assembly 10, upon interleaved engagement of first connector structure 12 and second connector structure 14, had a height of approximately 0.070 inches (1.778 mm).

EXAMPLE 4

A single, discrete electrical connector assembly conforming substantially to connector assembly 10 of FIG. 1, and formed with flex circuit layers, was constructed using the following technique. Each of connector layers 16, 20 was formed by a polyimide flex circuit layer having a single conductive layer comprising 0.001 inches (25.4 μm) of copper, 150 microinches (3.81 μm) of nickel, and 30 microinches (0.762 μm) of gold. Connector layers 16, 20, including the conductive layer, each had a thickness of approximately 0.003 inches (76.2 μm), a width of approximately 0.75 inches (1.905 cm), and a length of approximately 0.21 inches (5.334 mm), and produced an thin beam aspect ratio of approximately 70:1.

Each of connector layers 18, 26, 28 was formed by coupling together a pair of flex circuit layers with a layer of 3M VHB 9460 adhesive. Each of the flex circuit layers had a single conductive layer comprising 0.001 inches (25.4 μm) of copper, 150 microinches (3.81 μm) of nickel, and 30 microinches (0.762 μm) of gold. The adhesive layer had a thickness of approximately 0.002 inches (50.8 μm). Connector layers 18, 26, 28, including the pair of flex circuit layers, the conductive layer, and the adhesive layer, each had a thickness of approximately 0.008 inches (203.2 μm), a width of approximately 0.75 inches (1.905 cm), and a length of approximately 0.21 inches (5.334 mm). The connector layers 18, 26, 28 each produced a thin beam aspect ratio of approximately 26:1. All flex circuit layers used to form connector layers 16, 18, 20, 26, 28 were obtained from 3M Company of St. Paul, Minn.

The conductive layers on connector layers 16, 18, 20, 26, 28 were patterned by conventional techniques to form conductive contact surfaces 32 and conductive traces 35.

The contact surfaces 32 had the following approximate dimensions: 0.050 inch (1.27 mm) centers, 0.025 inch (0.635 mm) stripes, and 0.20 inch (5.08 mm) lengths. The conductive traces 35 had the following approximate dimensions: 0.050 inch (1.27 mm) centers, 0.010 inch (0.254 mm) wide stripes, and 1.5 inch (3.81 cm) lengths.

Each of separation layers 22, 24, 30 also was formed by a layer of VHB 9460 adhesive, mentioned above, and available from 3M Company of St. Paul, Minn. The adhesive layers 22, 24, 30 each had a thickness of approximately 0.002 inches (50.8 μm), and were trimmed to have a width of approximately 0.75 inches (19.05 mm) and a length of approximately 1.0 inches (2.54 cm). The resulting separation layers 22, 24, 30 were placed between adjacent connector layers such that the width of each separation layer extended along the length of a respective connector layer, leaving gaps 40, 42, 44, as shown in FIG. 1, by which contact surfaces 32 could be accessed.

The separation layers 22, 24 and connector layers 16, 18, 20 were stacked to produce first connector structure 12, whereas separation layer 30 and connector layers 26, 28 were stacked to produce second connector structure 14. The adhesive forming separation layers 22, 24, and 30 served to bond the stacked structures together.

The layup for first connector structure 12, in stacked order from top to bottom, comprised:

```
flex circuit connector layer 20
conductive layer
3M VHB 9460 adhesive separation layer 24
conductive layer
flex circuit              ⎫
3M VHB 9460 adhesive layer ⎬ connector layer 18
flex circuit              ⎭
conductive layer
3M VHB 9460 adhesive separation layer 22
conductive layer
flex circuit connector layer 16
```

The lay-up for second connector structure 14, in stacked order from top to bottom, comprised:

```
conductive layer
flex circuit              ⎫
3M VHB 9460 adhesive layer ⎬ connector layer 28
flex circuit              ⎭
conductive layer
3M VHB 9460 adhesive separation layer 30
conductive layer
flex circuit              ⎫
3M VHB 9460 adhesive layer ⎬ connector layer 26
flex circuit              ⎭
conductive layer
```

The resulting connector assembly 10, upon interleaved engagement of first connector structure 12 and second connector structure 14, had a height of approximately 0.028 inches (0.711 mm), without the attachment of an external biasing means. With a normal force applied to the exterior of first connector structure 12 and second connector structure 14, in interleaved engagement, contact continuity was measured using a standard digital multimeter. The resistance between a conductive trace 35 in connector structure 12 and a mating conductive trace 35 in connector structure 14 was observed to vary in an approximate range of 0.2 ohms to 0.5 ohms.

Having described the exemplary embodiments of the invention, additional advantages and modifications will readily occur to those skilled in the art from consideration of the specification and practice of the invention disclosed herein. Therefore, the specification and examples should be considered exemplary only, with the true scope and spirit of the invention being indicated by the following claims.

What is claimed is:

1. A method for fabricating a plurality of electrical connector assemblies, the method comprising the steps of:

forming a plurality of first connector structures by a plurality of steps including:

providing a first connector layer, forming a plurality of conductive contact surfaces in each of a plurality of regions of said first connector layer, and separating sections of said first connector layer to form said plurality of said first connector structures, each of said sections including one of said regions of said first connector layer; and forming a plurality of second connector structures by a plurality of steps including:

providing a second connector and a third connector layer, each of said second and third connector layers including a material capable of resilient deformation;

forming a plurality of conductive contact surfaces in each of a plurality of regions of said second connector layer, forming a plurality of conductive contact surfaces in each of a plurality of regions of said third connector layers, providing a plurality of separation layers, placing said separation layers between said second and third connector layers to form a stacked structure, said second and third layers defining a gap therebetween substantially coplanar with said plurality of separation layers, and separating sections of said stacked structure, each of said sections forming one of said plurality of second connector structures, and each of said sections including one of said regions of said second connector layer, one of said regions of said third connector layer, and a portion of one of said separation layers, wherein said first connector layer is oriented to engage said gap upon engagement of said first connector structure and said second connector structure, thereby coupling at least some of the conductive contact surfaces of said first connector layer to at least some of the conductive contact surfaces of said second and third connector layers.

2. The method of claim 1, wherein said first connector layer and said gap are dimensioned such that, upon engagement of said first connector layer with said gap, said first connector layer applies a force to said second and third connector layers, said second and third connector layers resisting said force to thereby impart a compressive force against said first connector layer.

3. The method of claim 1, wherein each of said second and third connector layers includes a printed circuit board layer.

4. The method of claim 1, wherein each of said second and third connector layers includes a flex circuit layer.

5. The method of claim 1, wherein at least one of said first and second connector structures forms an integral part of a continuous printed circuit board, the connector layers of the respective one of said first and second connector structures forming printed circuit board layers of said continuous printed circuit board.

6. The method of claim 1, wherein at least one of said first and second connector structures forms an integral part of a continuous flex circuit, the connector layers of the respective one of said first and second connector structures forming flex circuit layers of said continuous flex circuit.

7. The method of claim 1, wherein said step of forming said plurality of first connector structures further includes the steps of:

providing fourth and fifth connector layers, each of said fourth and fifth connector layers including a material capable of resilient deformation, forming a plurality of conductive contact surfaces in each of a plurality of regions of said fourth connector layer, forming a plurality of conductive contact surfaces in each of a plurality of regions of said fifth connector layer, providing a plurality of second separation layers, and placing said second separation layers between said first, fourth, and fifth connector layers to form a second stacked structure, said first and fourth connector layers defining a second gap therebetween substantially coplanar with the second separation layers placed between said first and fourth connector layers, and said first and fifth connector layers defining a third gap therebetween substantially coplanar with the second separation layers placed between said first and fifth connector layers, wherein said step of separating said sections of said first connector layer includes separating sections of said second stacked structure, each of said sections of said second stacked structure forming one of said plurality of first connector structures, and each of said second sections including one of said regions of said first connector layer, one of said regions of said fourth connector layer, one of said regions of said fifth connector layer, and a portion of one of said second separation layers, wherein said second connector layer is oriented to engage said second gap and said third connector layer is oriented to engage said third gap upon engagement of said first connector structure and said second connector structure, thereby coupling at least some of the conductive contact surfaces of said first, fourth, and fifth connectors layer to at least some of the conductive contact surfaces of said second and third connector layers.

* * * * *